(12) United States Patent
Huang

(10) Patent No.: US 11,227,562 B2
(45) Date of Patent: Jan. 18, 2022

(54) SHIFT REGISTER, DRIVING METHOD THEREOF, GATE DRIVER CIRCUIT AND DISPLAY DEVICE

(71) Applicants: BOE TECHNOLOGY GROUP CO., LTD., Beijing (CN); ORDOS YUANSHENG OPTOELECTRONICS CO., LTD., Inner Mongolia (CN)

(72) Inventor: Fei Huang, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 476 days.

(21) Appl. No.: 16/313,747

(22) PCT Filed: May 24, 2018

(86) PCT No.: PCT/CN2018/088214
§ 371 (c)(1),
(2) Date: Dec. 27, 2018

(87) PCT Pub. No.: WO2019/037496
PCT Pub. Date: Feb. 28, 2019

(65) Prior Publication Data
US 2021/0233483 A1    Jul. 29, 2021

(30) Foreign Application Priority Data
Aug. 21, 2017  (CN) .......................... 201710718885.2

(51) Int. Cl.
G09G 3/36       (2006.01)
G11C 19/28      (2006.01)

(52) U.S. Cl.
CPC ......... G09G 3/3677 (2013.01); G09G 3/3674 (2013.01); G11C 19/28 (2013.01);
(Continued)

(58) Field of Classification Search
CPC ............... G09G 3/3677; G09G 3/3674; G09G 2310/0286; G11C 19/28
See application file for complete search history.

(56) References Cited

U.S. PATENT DOCUMENTS 6,919,875 B2   7/2005  Shinichi et al.
7,602,215 B2   10/2009 Osame et al.
(Continued)

FOREIGN PATENT DOCUMENTS

CN    1969341    5/2007
CN    102324221  1/2012
(Continued)

OTHER PUBLICATIONS

English translated International Search Report from PCT/CN2018/088214 dated Sep. 3, 2018.

*Primary Examiner* — Xuemei Zheng
(74) *Attorney, Agent, or Firm* — Calfee, Halter & Griswold LLP

(57) ABSTRACT

The present disclosure provides a shift register, a driving method thereof, a gate driver circuit and a display device. The shift register includes a first control module, a scanning control module and a first output module.

19 Claims, 7 Drawing Sheets

(52) U.S. Cl.
CPC .............. *G09G 2300/0408* (2013.01); *G09G 2300/0426* (2013.01); *G09G 2310/0283* (2013.01); *G09G 2310/0286* (2013.01); *G09G 2310/08* (2013.01)

(56) References Cited

U.S. PATENT DOCUMENTS

| | | |
|---|---|---|
| 7,843,217 B2 | 11/2010 | Osame et al. |
| 8,035,415 B2 | 10/2011 | Osame et al. |
| 8,476,932 B2 | 7/2013 | Wang et al. |
| 8,664,976 B2 | 3/2014 | Mitsuaki et al. |
| 9,275,589 B2 | 3/2016 | Like et al. |
| 9,881,542 B2 | 1/2018 | Kai |
| 2008/0273004 A1 | 11/2008 | Mitsuaki et al. |
| 2010/0034338 A1 | 2/2010 | Osame et al. |
| 2011/0068824 A1 | 3/2011 | Osame et al. |
| 2012/0019300 A1 | 1/2012 | Osame et al. |
| 2012/0133392 A1 | 5/2012 | Wang et al. |
| 2014/0204011 A1 | 7/2014 | Like et al. |
| 2017/0039973 A1* | 2/2017 | Huang .................. G09G 3/3677 |
| 2017/0193946 A1* | 7/2017 | Huang .................. G11C 19/28 |
| 2017/0200408 A1 | 7/2017 | Kai |

FOREIGN PATENT DOCUMENTS

| | | |
|---|---|---|
| CN | 103106881 | 5/2013 |
| CN | 104269145 | 1/2015 |
| CN | 104966480 | 10/2015 |
| CN | 104992662 | 10/2015 |
| CN | 105609071 | 5/2016 |
| EP | 1756834 | 8/2009 |
| EP | 2104110 A1 | 9/2009 |
| EP | 2104110 B1 | 8/2013 |
| JP | 2002229500 | 8/2002 |
| JP | 3780852 | 5/2006 |
| WO | 2005/122178 | 12/2005 |

\* cited by examiner

SHIFT REGISTER, DRIVING METHOD THEREOF, GATE DRIVER CIRCUIT AND DISPLAY DEVICE

The present disclosure is based on International application No. PCT/CN2018/088214, filed on May 24, 2018, which claims priority to Chinese patent application No. 201710718885.2, filed on Aug. 21, 2017, and the entire contents thereof are incorporated herein by reference.

TECHNICAL FIELD

The present disclosure relates to the field of display technology, especially to a shift register, a driving method thereof, a gate driver circuit and a display device.

BACKGROUND

In a thin film transistor (TFT) display, gate driver signals are usually provided to gate electrodes of TFTs in pixel regions through a gate driver circuit. The gate driver circuit can be formed on an array substrate of a liquid crystal (LC) display by using an array process, that is, a gate driver on array (GOA) process. Such integrated process not only saves cost but also achieves a symmetrical, artistic design at both sides of a LC panel; at the same time, it also omits a bonding area for integrated circuit (IC) and a wiring space for fan-out, thereby achieving a design of narrow bezel; moreover, such integrated process also eliminates a bonding process along a direction of gate scanning line, so as to improve a production capacity and a product yield.

At present, an existing gate driver circuit is consisted of a plurality of cascaded shift registers, and each stage of shift register inputs a gate driver signal to a corresponding gate scanning line on a display panel mainly under the control of a clock signal and a scan triggering signal sent by a previous stage of shift register. However, with the development of display technology, people have more and more strict requirements on pixels of the display panel; as a result, the number of shift registers in the gate driver circuit for sending the gate driver signal to the gate scanning line on the display panel is increased.

However, in the existing gate driver circuit, it usually adopts larger number of complex structures such as three-state gate and NAND gate, which complicates a circuit structure and a working process of the gate driver circuit, increases a production cost and also raises a power consumption of the gate driver circuit.

Therefore, it has become an urgent problem to be solved by those skilled in the art that how to simplify the structure of the gate driver circuit and save the production cost so that the working process of the gate driver circuit can be simple and effective.

SUMMARY

Embodiments of the present disclosure provide a shift register, a driving method thereof, a gate driver circuit and a display device.

In one aspect, embodiments of the present disclosure provide a shift register, including:

a first control module, the first control module being connected to a first signal input end, a second signal input end, a first clock signal end, a first voltage signal end and a first node, respectively; the first control module being configured to provide a first clock signal outputted by the first clock signal end to the first node if at least one of impulse signals inputted by the first signal input end and the second signal input end is a turned-on pulse signal, and to provide a first voltage signal outputted by the first voltage signal end to the first node if both of the pulse signals inputted by the first signal input end and the second signal input end are cut-off pulse signals;

a scanning control module, the scanning control module being connected to the first signal input end, the second signal input end and a second node, respectively; the scanning control module being configured to provide a signal of the first signal input end to the second node during forward scanning and to provide a signal of the second signal input end to the second node during reverse scanning; and a first output control module, the first output control module being connected to the first node, the second node and a first output end, respectively; the first output control module being configured to output an electric potential of the second node to the first output end under the control of an electric potential of the first node.

In some possible implementations, the shift register provided by the embodiments of the present disclosure further includes:

a second control module, wherein the second control module is connected to the first output end, a second clock signal end, a third node and a second voltage signal end, respectively; the second control module is configured to provide a second clock signal outputted by the second clock signal end or a second voltage signal outputted by the second voltage signal end to the third node under the control of an electric potential of the first output end; and a second output control module, wherein the second output control module is connected to the third node, a reset signal end, N third clock signal ends and N second output ends, respectively; the second output control module is configured to provide a reset signal outputted by the reset signal end to the N second output ends under the control of an electric potential of the third node, or to provide a clock signal outputted by a $n^{th}$ third clock signal end to a $n^{th}$ second output end under the control of an electric potential of the third node; N is a positive integer greater than or equal to 1, the $n^{th}$ second output end belongs to the N second output ends;

wherein a phase of the first clock signal is opposite to a phase of the second clock signal; a clock period of a clock signal outputted by each of the third clock signal ends is equal to ½ of a clock period of the first clock signal; a duty cycle of the clock signal outputted by the third clock signal end is 1/N; when the first clock signal starts to output a high level pulse signal, phases of clock signals outputted by a $1^{st}$ third clock signal end to a $N^{th}$ third clock signal end are sequentially delayed by $2\pi/N$.

In some possible implementations, in the shift register provided by the embodiments of the present disclosure, the first control module includes:

a NOR gate, wherein an input end of the NOR gate is connected to the first signal input end and the second signal input end, respectively; an output end of the NOR gate is connected to an input end of a first phase inverter, a reverse phase control end of a first transmission gate and a gate electrode of a first switch transistor, respectively;

a first phase inverter, wherein the input end of the first phase inverter is connected to the output end of the NOR gate; an output end of the first phase inverter is connected to a positive phase control end of the first transmission gate;

a first transmission gate, wherein an input end of the first transmission gate is connected to the first clock signal end, an output end of the first transmission gate is connected to the first node, a positive phase control end of the first transmission gate is connected to the output end of the first phase inverter, the reverse phase control end of the first transmission gate is connected to the output end of the NOR gate; and a first switch transistor, wherein the gate electrode of the first switch transistor is connected to the output end of the NOR gate, a source electrode of the first switch transistor is connected to the first voltage signal end, a drain electrode of the first switch transistor is connected to the first node, wherein the first switch transistor is a N-type transistor.

In some possible implementations, in the shift register provided by the embodiments of the present disclosure, the scanning control module includes:

a second transmission gate, wherein a reverse phase control end of the second transmission gate is connected to a third voltage signal end; a positive phase control end of the second transmission gate is connected to a fourth voltage signal end; an input end of the second transmission gate is connected to the first signal input end; an output end of the second transmission gate is connected to the second node; and a third transmission gate, wherein a reverse phase control end of the third transmission gate is connected to the fourth voltage signal end; a positive phase control end of the third transmission gate is connected to the third voltage signal end; an input end of the third transmission gate is connected to the second signal input end; an output end of the third transmission gate is connected to the second node.

In some possible implementations, in the shift register provided by the embodiments of the present disclosure, the first output control module includes:

a second switch transistor, wherein a gate electrode of the second switch transistor is connected to the first node; a source electrode of the second switch transistor is connected to the second node;

a second phase inverter, wherein an input end of the second phase inverter is connected to the first node; and a third switch transistor, wherein a gate electrode of the third switch transistor is connected to an output end of the second phase inverter, a drain electrode of the third switch transistor is connected to a drain electrode of the second switch transistor;

wherein both of the second switch transistor and the third switch transistor are N-type transistors.

In some possible implementations, in the shift register provided by the embodiments of the present disclosure, the first output control module further includes:

a third phase inverter, wherein an input end of the third phase inverter is connected to the drain electrode of the second switch transistor and the drain electrode of the third switch transistor, respectively;

a fourth phase inverter, wherein an output end of the fourth phase inverter is connected to a source electrode of the third switch transistor; and a fifth phase inverter, wherein an input end of the fifth phase inverter is connected to an output end of the third phase inverter and an input end of the fourth phase inverter, respectively; an output end of the fifth phase inverter is connected to the first output end.

In some possible implementations, the shift register provided by the embodiments of the present disclosure further includes:

a fourth switch transistor, wherein a gate electrode of the fourth switch transistor is connected to the reset signal end; a source electrode of the fourth switch transistor is connected to a fifth voltage signal end; a drain electrode of the fourth switch transistor is connected to the input end of the fifth phase inverter, the output end of the third phase inverter and the output end of the fourth phase inverter, respectively;

wherein the fourth switch transistor is a N-type transistor.

In some possible implementations, in the shift register provided by the embodiments of the present disclosure, the second control module includes:

a fourth transmission gate, wherein an input end of the fourth transmission gate is connected to the second clock signal end; an output end of the fourth transmission gate is connected to the third node; a positive phase control end of the fourth transmission gate is connected to the first output end; a reverse phase control end of the fourth transmission gate is connected to an output end of a sixth phase inverter and a gate electrode of a fifth switch transistor;

the sixth phase inverter, wherein an input end of the sixth phase inverter is connected to the first output end; the output end of the sixth phase inverter is connected to the reverse phase control end of the fourth transmission end and the gate electrode of the fifth switch transistor, respectively; and the fifth switch transistor, wherein the gate electrode of the fifth switch transistor is connected to the output end of the sixth phase inverter and the reverse phase control end of the fourth transmission gate, respectively; a source electrode of the fifth switch transistor is connected to the third node; a drain electrode of the fifth switch transistor is connected to the second voltage signal end;

wherein the fifth switch transistor is a N-type transistor.

In some possible implementations, in the shift register provided by the embodiments of the present disclosure, the second output control module includes:

a seventh phase inverter, wherein an input end of the seventh phase inverter is connected to the third node; an output end of the seventh phase inverter is connected to one end of each of N output control sub-modules and an input end of an eighth phase inverter, respectively;

the eighth phase inverter, wherein the input end of the eighth phase inverter is connected to one end of each of the N output control sub-modules and the output end of the seventh phase inverter, respectively; an output end of the eighth phase inverter is connected the other end of each of the N output control sub-modules; and the N output control sub-modules, wherein each of the output control sub-modules is configured to provide a reset signal outputted by the reset signal end to a corresponding one of the N second output ends, under the control of an electric potential of the output end of the seventh phase inverter and an electric potential of the output end of the eighth phase inverter; or each of the output control sub-modules is configured to provide a clock signal outputted by a $n^{th}$ third clock signal end to a $n^{th}$ second output end, under the control of the electric potential of the output end of the seventh phase inverter and the electric potential of the output end of the eighth phase inverter.

In some possible implementations, in the shift register provided by the embodiments of the present disclosure, the output control sub-module includes:

a fifth transmission gate, wherein an input end of the fifth transmission gate is connected to the reset signal end; a positive phase control end of the fifth transmission gate is connected to the output end of the seventh phase inverter; a reverse phase control end of the fifth transmission gate is connected to the output end of the eighth phase inverter; and a sixth transmission gate, wherein an input end of the sixth transmission gate is connected to one of the N third clock signal ends; a reverse phase control end of the sixth transmission gate is connected to the output end of the seventh phase inverter; a positive phase control end of the sixth transmission gate is connected to the output end of the eighth phase inverter.

In some possible implementations, in the shift register provided by the embodiments of the present disclosure, the output control sub-module further includes:

a ninth phase inverter, wherein an input end of the ninth phase inverter is connected to an output end of the fifth transmission gate and an output end of the sixth transmission gate, respectively; an output end of the ninth phase inverter is connected to an input end of a tenth phase inverter; and the tenth phase inverter, wherein the input end of the tenth phase inverter is connected to the output end of the ninth phase inverter; an output end of the tenth phase inverter is connected to the second output end.

In some possible implementations, in the shift register provided by the embodiments of the present disclosure, N is equal to 4.

On another aspect, embodiments of the present disclosure further provide a shift register, including:

a first control module, the first control module being connected to a first signal input end, a second signal input end, a first clock signal end, a first voltage signal end and a first node, respectively; the first control module being configured to provide a first clock signal outputted by the first clock signal end to the first node if at least one of impulse signals inputted by the first signal input end and the second signal input end is a turned-on pulse signal, and to provide a first voltage signal outputted by the first voltage signal end to the first node if both of the pulse signals inputted by the first signal input end and the second signal input end are cut-off pulse signals;

a scanning control module, the scanning control module being connected to the first signal input end, the second signal input end and a second node, respectively; the scanning control module being configured to provide a signal of the first signal input end to the second node during forward scanning and to provide a signal of the second signal input end to the second node during reverse scanning;

a first output control module, the first output control module being connected to the first node, the second node and a first output end, respectively; the first output control module being configured to output an electric potential of the second node to the first output end under the control of an electric potential of the first node;

a fourth switch transistor, a gate electrode of the fourth switch transistor being connected to a reset signal end; a source electrode of the fourth switch transistor being connected to a fifth voltage signal end; a drain electrode of the fourth switch transistor being connected to an input end of a fifth phase inverter, an output end of a third phase inverter and an output end of a fourth phase inverter, respectively;

a second control module, the second control module being connected to the first output end, a second clock signal end, a third node and a second voltage signal end, respectively; the second control module being configured to provide a second clock signal outputted by the second clock signal end or a second voltage signal outputted by the second voltage signal end to the third node, under the control of an electric potential of the first output end;

a second output control module, the second output control module being connected to the third node, the reset signal end, N third clock signal ends and N second output ends, respectively; the second output control module being configured to provide a reset signal outputted by the reset signal end to the N second output ends under the control of an electric potential of the third node, or, to provide a clock signal outputted by a $n^{th}$ third clock signal end to a $n^{th}$ second output end under the control of the electric potential of the third node; wherein N is a positive integer greater than or equal to 1, the $n^{th}$ second output end belongs to the N second output ends;

wherein a phase of the first clock signal is opposite to a phase of the second clock signal; a clock period of a clock signal outputted by each of the third clock signal ends is equal to ½ of a clock period of the first clock signal; a duty cycle of the clock signal outputted by the third clock signal end is 1/N; when the first clock signal starts to output a high level pulse signal, phases of clock signals outputted by a $1^{st}$ third clock signal end to a $N^{th}$ third clock signal end are sequentially delayed by $2\pi/N$;

wherein the first control module includes:

a NOR gate, wherein an input end of the NOR gate is connected to the first signal input end and the second signal input end, respectively; an output end of the NOR gate is connected to an input end of a first phase inverter, a reverse phase control end of a first transmission gate and a gate electrode of a first switch transistor, respectively;

the first phase inverter, wherein the input end of the first phase inverter is connected to the output end of the NOR gate; an output end of the first phase inverter is connected to a positive phase control end of the first transmission gate;

the first transmission gate, wherein an input end of the first transmission gate is connected to the first clock signal end, an output end of the first transmission gate is connected to the first node, a positive phase control end of the first transmission gate is connected to the output end of the first phase inverter, the reverse phase control end of the first transmission gate is connected to the output end of the NOR gate; and the first switch transistor, wherein the gate electrode of the first switch transistor is connected to the output end of the NOR gate, a source electrode of the first switch transistor is connected to the first voltage signal end, a drain electrode of the first switch transistor is connected to the first node;

wherein the scanning control module includes:

a second transmission gate, wherein a reverse phase control end of the second transmission gate is connected to a third voltage signal end; a positive phase control end of the second transmission gate is connected to a fourth voltage signal end; an input end of the second transmission gate is connected to the first signal input end; an output end of the second transmission gate is connected to the second node; and a third transmission gate, wherein a reverse phase control end of the third transmission gate is connected to the fourth voltage signal end; a positive phase control end of the third transmission gate is connected to the third voltage signal end; an input end of the third transmission gate is connected to the second signal input end; an output end of the third transmission gate is connected to the second node;

wherein the first output control module includes:

a second switch transistor, wherein a gate electrode of the second switch transistor is connected to the first node; a source electrode of the second switch transistor is connected to the second node;

a second phase inverter, wherein an input end of the second phase inverter is connected to the first node;

a third switch transistor, wherein a gate electrode of the third switch transistor is connected to an output end of the second phase inverter, a drain electrode of the third switch transistor is connected to a drain electrode of the second switch transistor;

a third phase inverter, wherein an input end of the third phase inverter is connected to the drain electrode of the second switch transistor and the drain electrode of the third switch transistor, respectively;

a fourth phase inverter, wherein an output end of the fourth phase inverter is connected to a source electrode of the third switch transistor; and a fifth phase inverter, wherein an input end of the fifth phase inverter is connected to an output end of the third phase inverter and an input end of the fourth phase inverter, respectively; an output end of the fifth phase inverter is connected to the first output end;

wherein the second control module includes:

a fourth transmission gate, wherein an input end of the fourth transmission gate is connected to the second clock signal end; an output end of the fourth transmission gate is connected to the third node; a positive phase control end of the fourth transmission gate is connected to the first output end; a reverse phase control end of the fourth transmission gate is connected to an output end of a sixth phase inverter and a gate electrode of a fifth switch transistor;

the sixth phase inverter, wherein an input end of the sixth phase inverter is connected to the first output end; the output end of the sixth phase inverter is connected to the reverse phase control end of the fourth transmission end and the gate electrode of the fifth switch transistor, respectively; and the fifth switch transistor, wherein the gate electrode of the fifth switch transistor is connected to the output end of the sixth phase inverter and the reverse phase control end of the fourth transmission gate, respectively; a source electrode of the fifth switch transistor is connected to the third node; a drain electrode of the fifth switch transistor is connected to the second voltage signal end;

wherein the second output control module includes:

a seventh phase inverter, wherein an input end of the seventh phase inverter is connected to the third node; an output end of the seventh phase inverter is connected to one end of each of N output control sub-modules and an input end of an eighth phase inverter, respectively;

the eighth phase inverter, wherein the input end of the eighth phase inverter is connected to one end of each of the N output control sub-modules and the output end of the seventh phase inverter, respectively; an output end of the eighth phase inverter is connected the other end of each of the N output control sub-modules; and the N output control sub-modules, wherein each of the output control sub-modules is configured to provide a reset signal outputted by the reset signal end to a corresponding one of the N second output ends, under the control of an electric potential of the output end of the seventh phase inverter and an electric potential of the output end of the eighth phase inverter; or each of the output control sub-modules is configured to provide a clock signal outputted by a $n^{th}$ third clock signal end to a $n^{th}$ second output end, under the control of the electric potential of the output end of the seventh phase inverter and the electric potential of the output end of the eighth phase inverter;

wherein the output control sub-module includes:

a fifth transmission gate, wherein an input end of the fifth transmission gate is connected to the reset signal end; a positive phase control end of the fifth transmission gate is connected to the output end of the seventh phase inverter; a reverse phase control end of the fifth transmission gate is connected to the output end of the eighth phase inverter;

a sixth transmission gate, wherein an input end of the sixth transmission gate is connected to one of the N third clock signal ends; a reverse phase control end of the sixth transmission gate is connected to the output end of the seventh phase inverter; a positive phase control end of the sixth transmission gate is connected to the output end of the eighth phase inverter;

a ninth phase inverter, wherein an input end of the ninth phase inverter is connected to an output end of the fifth transmission gate and an output end of the sixth transmission gate, respectively; an output end of the ninth phase inverter is connected to an input end of a tenth phase inverter; and the tenth phase inverter, wherein the input end of the tenth phase inverter is connected to the output end of the ninth phase inverter; an output end of the tenth phase inverter is connected to the second output end;

wherein the first switch transistor, the second switch transistor, the third switch transistor, the fourth switch transistor and the fifth switch transistor each are a N-type transistor.

In another aspect, embodiments of the present disclosure further provide a gate driver circuit, including a plurality of cascaded shift registers, each being the shift register provided by any of the above embodiments of the present disclosure; wherein except for a first stage of shift register, the first signal input end of each of the rest stages of shift registers is connected to the first output end of a previous stage of shift register as cascaded; and except for a last stage of shift register, the second signal input end of each of the rest stages of shift registers is connected to the first output end of a next stage of shift register as cascaded.

In some possible implementations, the gate driver circuit provided by the embodiments of the present disclosure further includes:

the first signal input end of the first stage of shift register is connected to a frame triggering signal end;

the second signal input end of the last stage of shift register is connected to a frame ending signal end.

Correspondingly, embodiments of the present disclosure further provide a driving method of a shift register, including:

in a first time period, providing a high level signal to the first signal input end, providing a low level signal to the second signal input end, and providing a low level signal to the first clock signal end, the first output end outputting the low level signal;

in a second time period, providing a high level signal to the first signal input end, providing a low level signal to the second signal input end, and providing a high level signal to the first clock signal end, the first output end outputting the high level signal;

in a third time period, providing a low level signal to the first signal input end, providing a high level signal to the second signal input end, and providing a low level signal to the first clock signal end, the first output end outputting the high level signal;

in a fourth time period, providing a low level signal to the first signal input end, providing a high level signal to the second signal input end, and providing a high level signal to the first clock signal end, the first output end outputting the low level signal; and in a fifth time period, providing a low level signal to the first signal input end, providing a low level signal to the second signal input end, and providing a low level signal to the first clock signal end, the first output end outputting the low level signal.

In some possible implementations, when the shift register includes the second control module and the second output control module, the driving method further includes:

in a first time period, providing a high level signal to the second clock signal, and providing a low level signal to the reset signal end; the N second output ends all outputting low level signals;

in a second time period, providing a low level signal to the second clock signal, providing a low level signal to the reset signal end, and providing a high level signal sequentially to the N third clock signal ends; the N second output ends all outputting low level signals;

in a third time period, providing a high level signal to the second clock signal, providing a low level signal to the reset signal end, and providing a high level signal sequentially to the N third clock signal ends; the N second output ends sequentially outputting high level signals identical with signals provided by the N third clock signal input ends respectively;

in a fourth time period, providing a low level signal to the second clock signal, providing a low level signal to the reset signal end, and providing a high level signal sequentially to the N third clock signal ends; the N second output ends all outputting low level signals; and in a fifth time period, providing a high level signal to the second clock signal, providing a low level signal to the reset signal end, and providing a high level signal sequentially to the N third clock signal ends; the N second output ends all outputting low level signals.

In yet another aspect, embodiments of the present disclosure further provide a display device, including the gate driver circuit provided by any of the above embodiments of the present disclosure.

DETAILED DESCRIPTION

Hereinafter, specific implementations of the shift register, the driving method thereof, the gate driver circuit and the display device provided by the embodiments of the present disclosure will be described in details in conjunction with the accompanying drawings.

Figure 1:
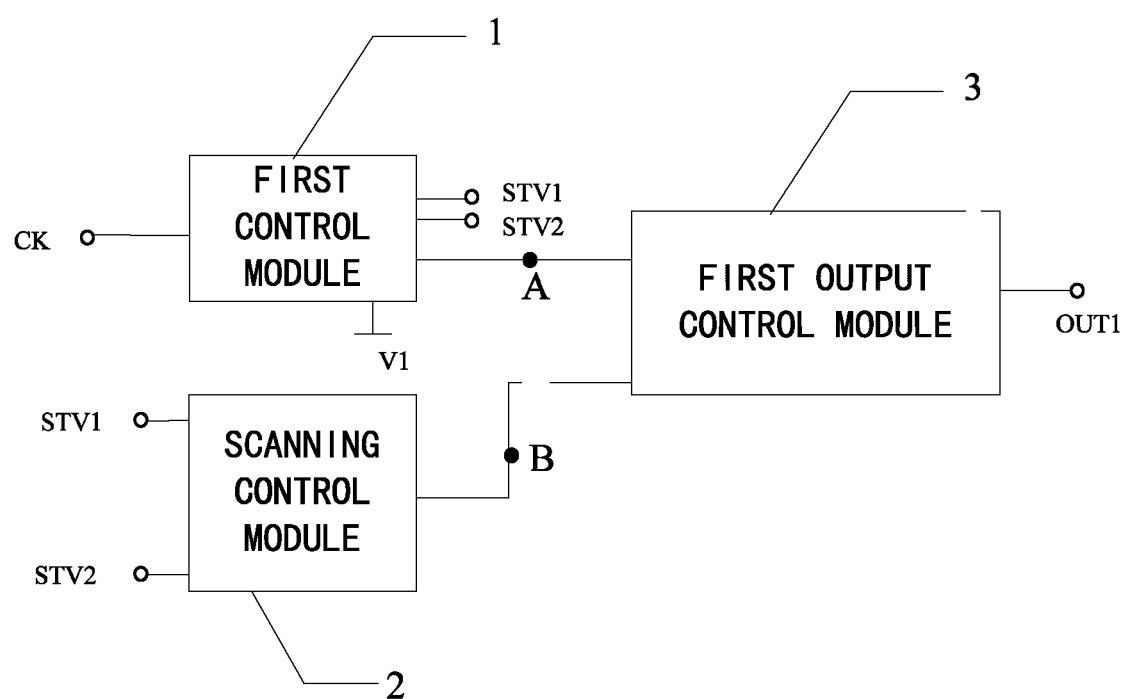
FIG. 1 is a first structural diagram of a shift register provided by an embodiment of the present disclosure.

Embodiments of the present disclosure provide a shift register. As illustrated in FIG. 1, the shift register includes a first control module 1, a scanning control module 2 and a first output control module 3.

The first control module 1 is connected to a first signal input end STV1, a second signal input end STV2, a first clock signal end CK, a first voltage signal end V1 and a first node A, respectively; the first control module 1 is configured to provide a first clock signal outputted by the first clock signal end CK to the first node A if at least one of impulse signals inputted by the first signal input end STV1 and the second signal input end STV2 is a high level pulse signal, or, to provide a first voltage signal outputted by the first voltage signal end V1 to the first node A if both of the pulse signals inputted by the first signal input end STV1 and the second signal input end STV2 are low level pulse signals.

The scanning control module 2 is connected to the first signal input end STV1, the second signal input end STV2 and a second node B, respectively; the scanning control module 2 is configured to provide a signal of the first signal input end STV1 to the second node B during forward scanning and to provide a signal of the second signal input end STV2 to the second node B during reverse scanning.

The first output control module 3 is connected to the first node A, the second node B and a first output end OUT1, respectively; the first output control module 3 is configured to output an electric potential of the second node B to the first output end OUT1 under the control of an electric potential of the first node A.

The above-mentioned shift register provided by the embodiments of the present disclosure includes a first control module, a scanning control module and a first output control module. The first control module is configured to provide a first clock signal outputted by the first clock signal end to the first node if at least one of impulse signals inputted by the first signal input end and the second signal input end is a high level pulse signal, or, to provide a first voltage signal outputted by the first voltage signal end to the first node if both of the pulse signals inputted by the first signal input end and the second signal input end are low level pulse signals. The scanning control module is configured to provide a signal of the first signal input end to the second node during forward scanning and to provide a signal of the second signal input end to the second node during reverse scanning. The first output control module is configured to output an electric potential of the second node to the first output end under the control of an electric potential of the first node. The arrangement of the above-mentioned modules simplifies the working process of the shift register; furthermore, the control for the first signal input end, the second signal input end and the modules allows the first clock signal end to output only two pulses during every scanning time for one row, which reduces a switching frequency and well lowers the power consumption.

It should be explained that, in the shift register provided by the embodiments of the present disclosure, one of the pulse signal sent by the first signal input end and the pulse signal sent by the second signal input end is identical with a scan triggering signal, and the other one delays the first clock signal by one clock period with respect to the scan triggering signal.

Hereinafter, the present disclosure will be described in more details in conjunction with specific embodiments. It should be explained that, these embodiments are intended to explain the present disclosure in a better way, without limiting the present disclosure.

Figure 2:
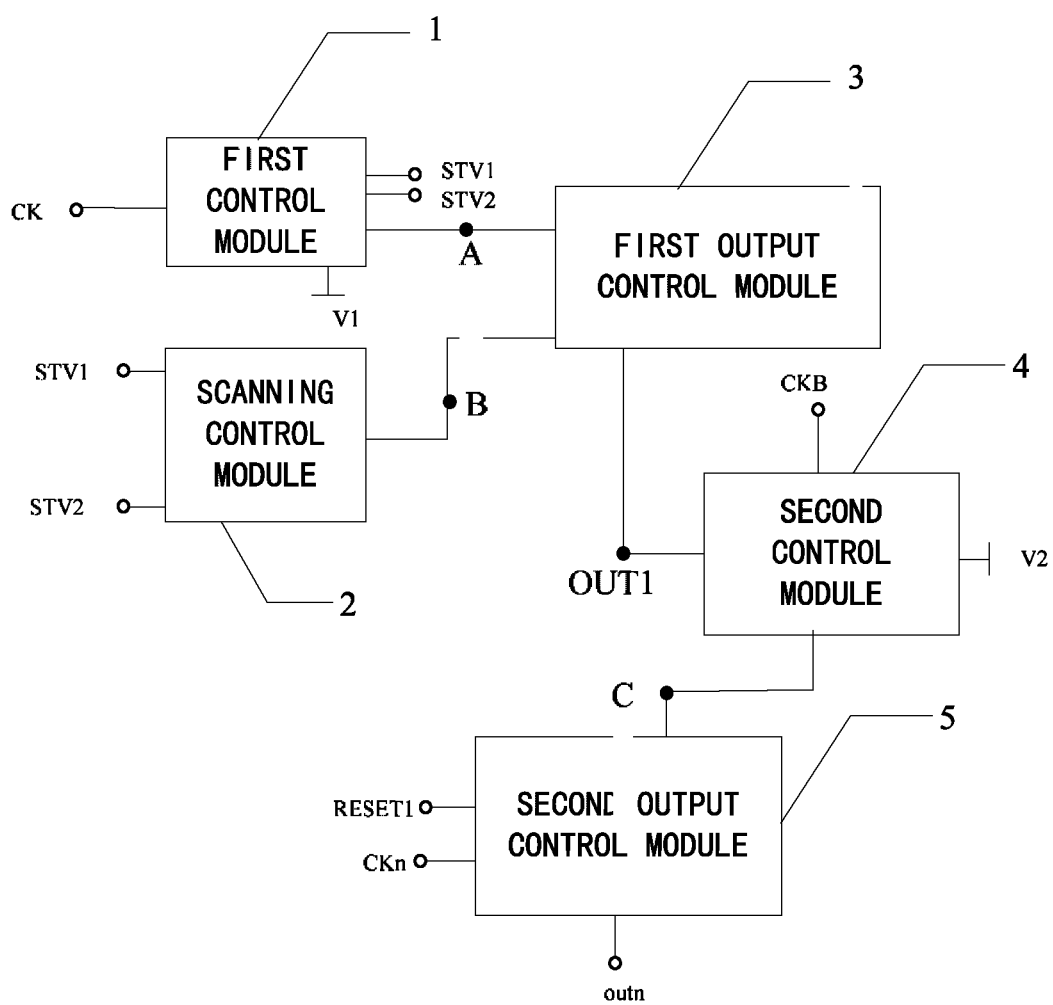
FIG. 2 is a second structural diagram of a shift register provided by an embodiment of the present disclosure.

Particularly, as illustrated in FIG. 2, the shift register provided by the embodiments of the present disclosure further includes a second control module 4 and a second output control module 5.

The second control module 4 is connected to the first output end OUT1, a second clock signal end CKB, a third node C and a second voltage signal end V2, respectively; the second control module 4 is configured to provide a second clock signal outputted by the second clock signal end CKB or a second voltage signal outputted by the second voltage signal end V2 to the third node C under the control of an electric potential of the first output end OUT1.

The second output control module 5 is connected to the third node C, a reset signal end RESET, N third clock signal ends CKn and N second output ends outn, respectively; the second output control module 5 is configured to provide a reset signal outputted by the reset signal end RESET1 to the N second output ends outn under the control of an electric potential of the third node C, or to provide a clock signal outputted by a $n^{th}$ third clock signal end CKn to a $n^{th}$ second output end outn under the control of the electric potential of the third node C; N is a positive integer greater than or equal to 1, and n belongs to N.

A phase of the first clock signal is opposite to a phase of the second clock signal; a clock period of a clock signal outputted by each of the third clock signal ends is equal to ½ of a clock period of the first clock signal; a duty cycle of the clock signal outputted by the third clock signal end is 1/N; when the first clock signal starts to output a high level pulse signal, phases of clock signals outputted by the $1^{st}$ third clock signal end to the $N^{th}$ third clock signal end are sequentially delayed by $2\pi/N$.

During specific implementation, in the shift register provided by the embodiments of the present disclosure, with the arrangement of the second control module and the second output control module, a one-stage circuit can output gate signals required by multiple stages, which can considerably reduce the entire power consumption of the display panel.

Figure 3:
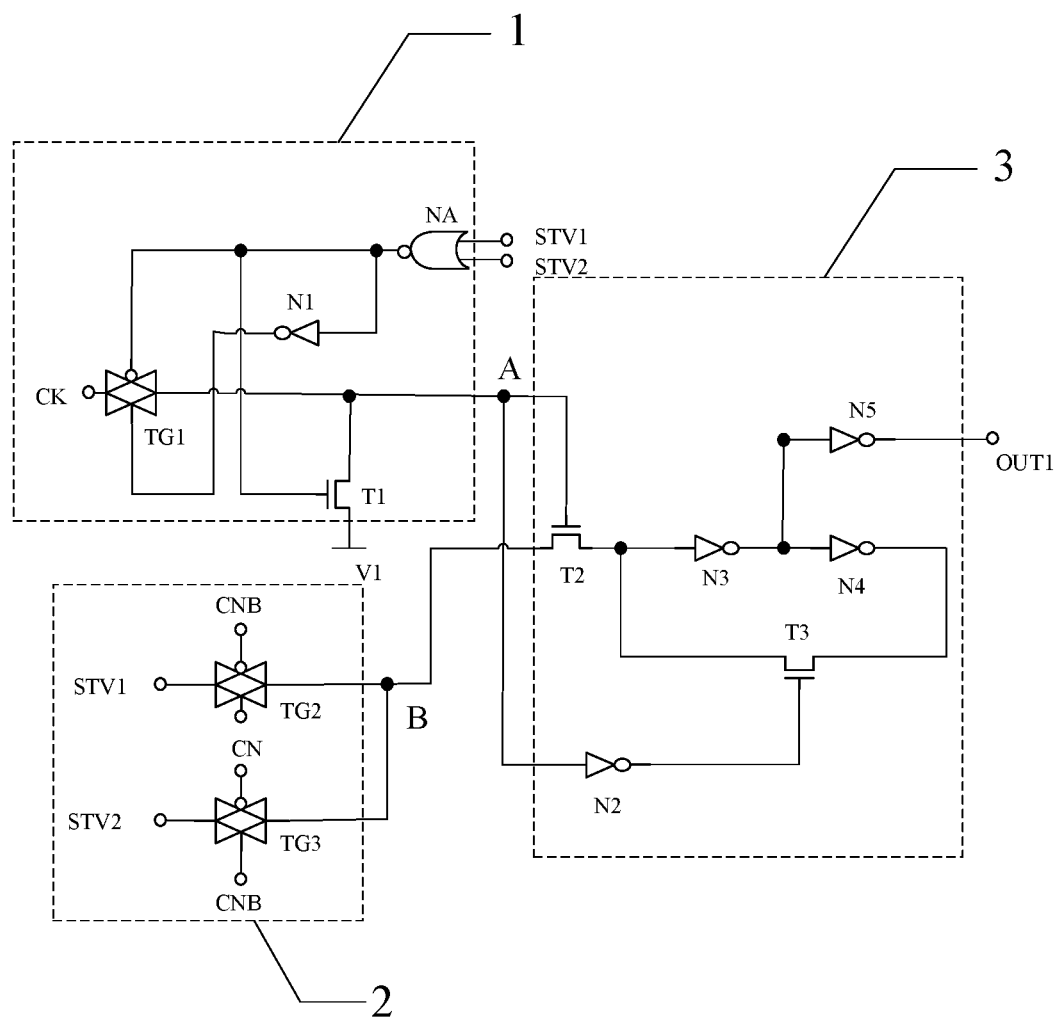
FIG. 3 is a first particular structural diagram of a shift register provided by an embodiment of the present disclosure.

Particularly, in the shift register provided by the embodiments of the present disclosure, as illustrated in FIG. 3, the first control module 1 includes a NOR gate NA, a first phase inverter N1, a first transmission gate TG1 and a first switch transistor T1.

An input end of the NOR gate NA is connected to the first signal input end STV1 and the second signal input end STV2, respectively; an output end of the NOR gate NA is connected to an input end of the first phase inverter N1, a reverse phase control end of the first transmission gate TG1 and a gate electrode of the first switch transistor T1, respectively.

The input end of the first phase inverter N1 is connected to the output end of the NOR gate NA; an output end of the first phase inverter N1 is connected to a positive phase control end of the first transmission gate TG1.

An input end of the first transmission gate TG1 is connected to the first clock signal end CK; an output end of the first transmission gate TG1 is connected to the first node A; a positive phase control end of the first transmission gate TG1 is connected to the output end of the first phase inverter N1; and the reverse phase control end of the first transmission gate TG1 is connected to the output end of the NOR gate NA.

The gate electrode of the first switch transistor T1 is connected to the output end of the NOR gate NA; a source electrode of the first switch transistor T1 is connected to the first voltage signal end V1; and a drain electrode of the first switch transistor T1 is connected to the first node A. The first switch transistor T1 is a N-type transistor.

Particularly, during specific implementation, when at least one of pulse signals inputted by the first signal input end STV1 and the second signal input end STV2 is a high level pulse signal, the output end of the NOR gate NA provides a low level pulse signal to the input end of the first phase inverter N1, the reverse phase control end of the first transmission gate TG1 and the gate electrode of the first switch transistor T1; the output end of the first phase inverter N1 outputs a high level signal and provides the high level signal to the positive phase control end of the first transmission gate TG1; since the first switch transistor T1 is a N-type transistor, the first switch transistor T1 is cut off; at this time, the first transmission gate TG1 is turned on, the first clock signal CK is transmitted to the first node A through the first transmission gate TG1; when both of the pulse signals inputted by the first signal input end STV1 and the second signal input end STV2 are low level pulse signals, the output end of the NOR gate NA provides a high level pulse signal to the input end of the first phase inverter N1, the reverse phase control end of the first transmission gate TG1 and the gate electrode of the first switch transistor T1; the output end of the first phase inverter N1 outputs a low level signal and provides the low level signal to the positive phase control end of the first transmission gate TG1; at this time, the first transmission gate TG1 is cut off, the first switch transistor is turned on and provides the first voltage outputted by the first voltage signal end V1 to the first node A; the first voltage usually is at low level or is a grounding voltage.

The above merely is to illustrate a structure of the first control module in the shift register by way of example. During specific implementation, the particular structure of the first control module is not limited to the structure provided by the embodiments of the present disclosure but can also be other structures well-known for those skilled in the art, without limited herein.

Particularly, in the shift register provided by the embodiments of the present disclosure, as illustrated in FIG. 3, the scanning control module 2 includes a second transmission gate TG2 and a third transmission gate TG3.

A reverse phase control end of the second transmission gate TG2 is connected to a third voltage signal end CN; a positive phase control end of the second transmission gate TG2 is connected to a fourth voltage signal end CNB; an input end of the second transmission gate TG2 is connected to the first signal input end STV1; an output end of the second transmission gate TG2 is connected to the second node B.

A reverse phase control end of the third transmission gate TG3 is connected to the fourth voltage signal end CNB; a positive phase control end of the third transmission gate TG3 is connected to the third voltage signal end CN; an input end of the third transmission gate TG3 is connected to the second signal input end STV2; an output end of the third transmission gate TG3 is connected to the second node B.

In specific implementation, the input end of the second transmission gate TG2 is connected to the first signal input end STV1, and the second transmission gate TG2 is configured to provide a signal of the first signal input end STV1 to the second node B under the control of the third voltage signal end CN and the fourth voltage signal end CNB during forward scanning; the input end of the third transmission gate TG3 is connected to the second signal input end STV2, and the third transmission gate TG3 is configured to provide a signal of the second signal input end STV2 to the second node B under the control of the third voltage signal end CN and the fourth voltage signal end CNB during reverse scanning. During forward scanning, the third voltage signal sent by the third voltage signal end CN is at low level, and the fourth voltage signal sent by the fourth voltage signal end CNB is at high level; during reverse scanning, the third voltage signal sent by the third voltage signal end CN is at high level, and the fourth voltage signal sent by the fourth voltage signal end CNB is at low level.

The above merely is to illustrate a structure of the scanning control module in the shift register by way of example. During specific implementation, the particular structure of the scanning control module is not limited to the structure provided by the embodiments of the present disclosure but can also be other structures well-known for those skilled in the art, without limited herein.

Particularly, in the shift register provided by the embodiments of the present disclosure, as illustrated in FIG. 3, the first output control module 3 includes a second switch transistor T2, a third switch transistor T3, a second phase inverter N2, a third phase inverter N3, a fourth phase inverter N4 and a fifth phase inverter N5.

Agate electrode of the second switch transistor T2 is connected to the first node A; a source electrode of the second switch transistor T2 is connected to the second node B; a drain electrode of the second switch transistor T2 is connected to an input end of the third phase inverter N3 and a drain electrode of the third switch transistor T3, respectively.

An input end of the second phase inverter N2 is connected to the first node A; and an output end of the second phase inverter N2 is connected to a gate electrode of the third switch transistor T3.

The input end of the third phase inverter N3 is connected to the drain electrode of the second switch transistor T2 and the drain electrode of the third switch transistor T3, respectively; an output end of the third phase inverter N3 is connected to an input end of the fourth phase inverter N4 and an input end of the fifth phase inverter N5, respectively.

The input end of the fourth phase inverter N4 is connected to the output end of the third phase inverter N3 and the input end of the fifth phase inverter N5, respectively; an output end of the fourth phase inverter N4 is connected to a source electrode of the third switch transistor T3.

The gate electrode of the third switch transistor T3 is connected to the output end of the second phase inverter N2; the source electrode of the third switch transistor T3 is connected to the output end of the fourth phase inverter N4; the drain electrode of the third switch transistor T3 is connected to the drain electrode of the second switch transistor T2 and the input end of the third phase inverter N3, respectively.

The input end of the fifth phase inverter N5 connected to the output end of the third phase inverter N3 and the input end of the fourth phase inverter N4, respectively; the output end of the fifth phase inverter N5 is connected to the first output end OUT1.

Both of the second switch transistor T2 and the third switch transistor T3 are N-type transistor.

In specific implementation, the second switch transistor is a N-type switch transistor, and hence is configured to provide an electric potential of the second node B to the input end of the third phase inverter N3 if an electric potential of the first node A is at high level; when the electric potential of the first node A is at high level, the second switch transistor T2 is turned on, the output end of the second phase inverter N2 outputs a low level signal, and the third switch transistor T3 is cut off; when the electric potential of the first node A is at low level, the second switch transistor T2 is cut off, and the output end of the second phase inverter N2 outputs a high level signal; at this time, the third switch transistor is a N-type switch transistor and hence is turned on, the third phase inverter N3 and the fourth phase inverter N4 are connected end to end to constitute a bi-stable structure; that is, the input end of the third phase inverter N3 is connected to the output end of the fourth phase inverter N4 through the third switch transistor T3, the output end of the third phase inverter N3 is connected to the input end of the fourth phase inverter N4; the above-mentioned connection mode maintains a stability of the output of the third phase inverter N3, so as to ensure the stability of the signal outputted by the first output end OUT1.

The above merely is to illustrate a structure of the first output control module in the shift register by way of example. During specific implementation, the particular structure of the first output control module is not limited to the structure provided by the embodiments of the present disclosure but can also be other structures well-known for those skilled in the art, without limited herein.

Figure 4:
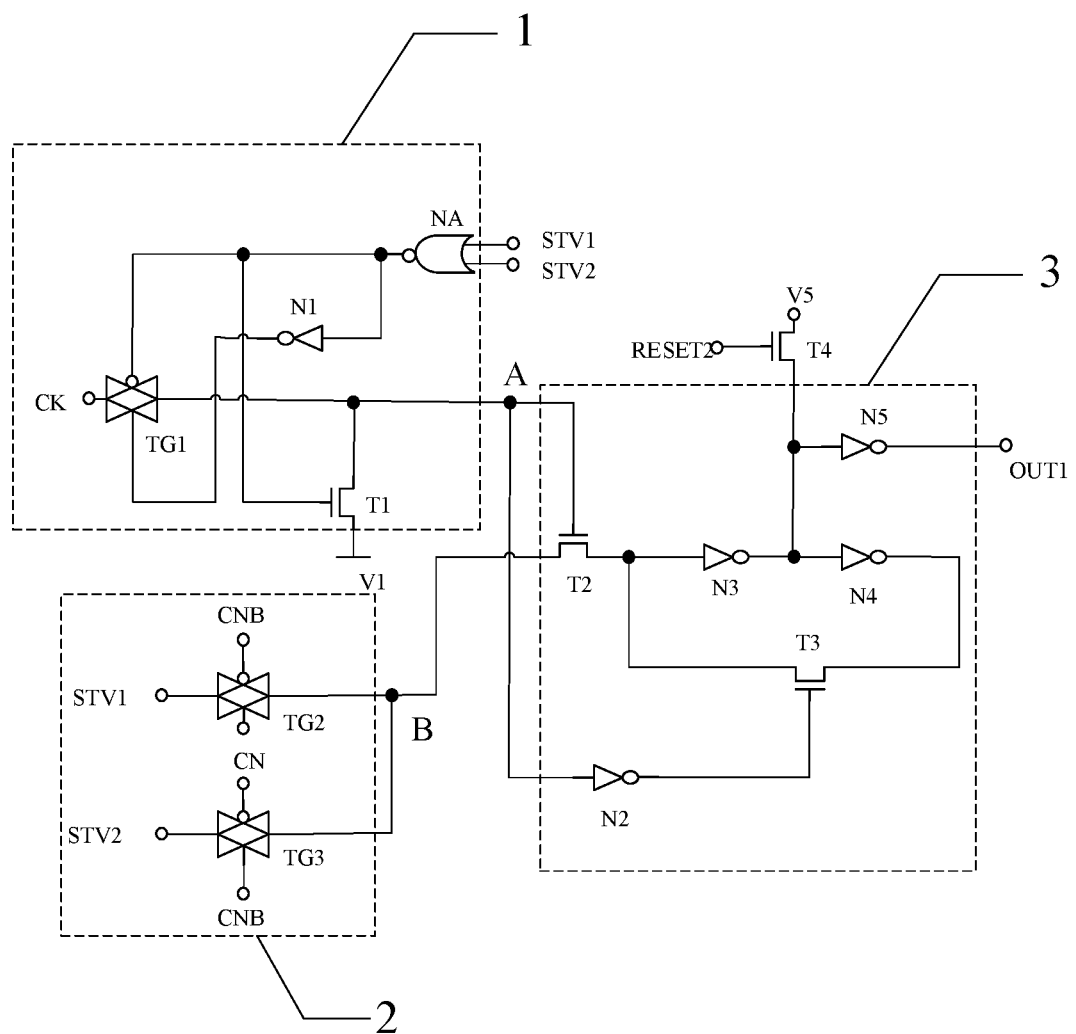
FIG. 4 is a second particular structural diagram of a shift register provided by an embodiment of the present disclosure.

Particularly, as illustrated in FIG. 4, the shift register provided by the embodiments of the present disclosure further includes a fourth switch transistor T4.

A gate electrode of the fourth switch transistor T4 is connected to a reset signal end RESET2; a source electrode of the fourth switch transistor T4 is connected to a fifth voltage signal end V5; a drain electrode of the fourth switch transistor T4 is connected to the input end of the fifth phase inverter N5, the output end of the third phase inverter N3 and the input end of the fourth phase inverter N4, respectively.

The fourth switch transistor T4 is a N-type transistor.

In specific implementation, when the shift register performs scanning, the reset signal outputted by the reset signal end RESET2 is a low level signal, and the fourth switch transistor T4 is turned off because it's a N-type switch transistor; when the shift register is in a quick discharge state, the reset signal outputted by the reset signal end RESET2 is a high level signal; at this time, the fourth switch transistor T4 is turned on and provides a voltage outputted by the fifth voltage signal end V5 to the input end of the fifth phase inverter N5, so that the signal outputted by the first output end OUT1 is at low level; the signal outputted by the fifth voltage signal end V5 is a high level signal.

Figure 5:
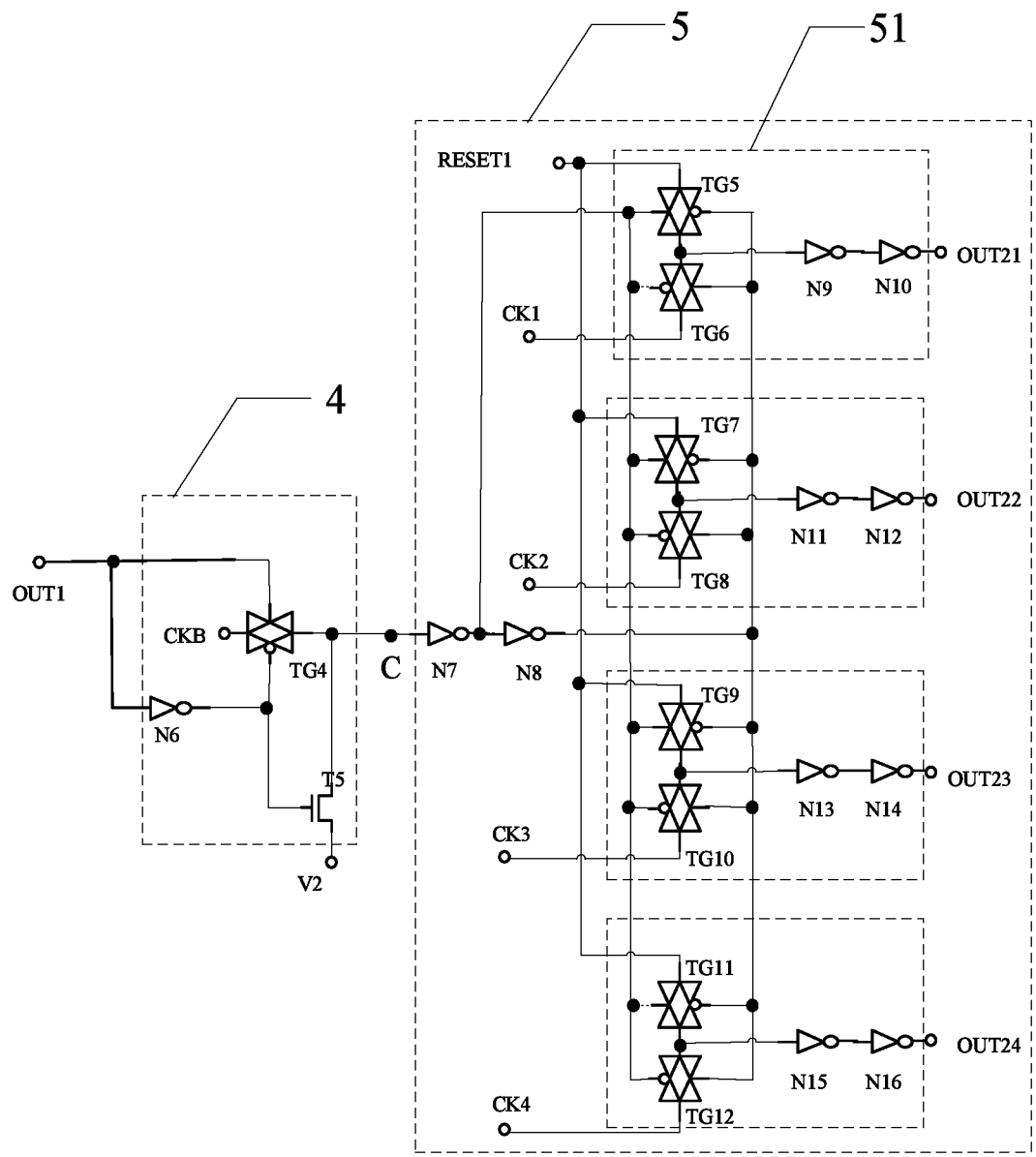
FIG. 5 is a third particular structural diagram of a shift register provided by an embodiment of the present disclosure.

During specific implementation, in order to achieve multi-stage output through one-stage input so as to save the power consumption of the shift register, in the shift register provided by the embodiments of the present disclosure, as illustrated in FIG. 5, the second control module 4 includes a fourth transmission gate TG4, a sixth phase inverter N6 and a fifth switch transistor T5.

An input end of the fourth transmission gate TG4 is connected to the second clock signal end CKB; an output end of the fourth transmission gate TG4 is connected to the third node C; a positive phase control end of the fourth transmission gate TG4 is connected to the first output end OUT1; a reverse phase control end of the fourth transmission gate TG4 is connected to an output end of a sixth phase inverter N6 and a gate electrode of a fifth switch transistor T5, respectively.

An input end of the sixth phase inverter N6 is connected to the first output end OUT1; the output end of the sixth phase inverter N6 is connected to the reverse phase control end of the fourth transmission end TG4 and the gate electrode of the fifth switch transistor T5, respectively.

The gate electrode of the fifth switch transistor T5 is connected to the output end of the sixth phase inverter N6 and the reverse phase control end of the fourth transmission gate TG4, respectively; a source electrode of the fifth switch transistor T5 is connected to the third node C; a drain electrode of the fifth switch transistor T5 is connected to the second voltage signal end V2.

The fifth switch transistor T5 is a N-type transistor.

In specific implementation, when the signal of the first output end OUT1 is at high level, it's provided to the positive phase control end of the fourth transmission gate TG4 and the input end of the sixth phase inverter N6, respectively; the output end of the sixth phase inverter N6 provides the low level signal as outputted to the reverse phase control end of the fourth transmission gate TG4 and the gate electrode of the fifth switch transistor T5, respectively; at this time, the fifth switch transistor T5 is cut off, the fourth transmission gate TG4 is turned on, and the second clock signal sent by the second clock signal end CKB is transmitted to the third node C through the turned on, fourth transmission gate TG4. As a result, when the electric potential of the first output end OUT1 is at high level, the second clock signal outputted by the second clock signal end CKB is provided to the third node C; when the electric potential of the first output end OUT1 is at low level, the signal of the first output end OUT1 is provided to the positive phase control end of the fourth transmission gate TG4 and the input end of the sixth phase inverter N6, respectively; the output end of the sixth phase inverter N6 provides the high level signal as outputted to the reverse phase control end of the fourth transmission gate TG4 and the gate electrode of the fifth switch transistor T5, respectively; at this time, the fourth transmission gate TG4 is cut off, the fifth switch transistor T5 is turned on, the second voltage signal sent by the second voltage signal end V2 is provided to the third node C through the turned on, fifth switch transistor T5, in which the second voltage signal sent by the second voltage signal end V2 is a low level signal. As a result, when the voltage of the first output end OUT1 is at low level, the second voltage signal sent by the second voltage signal end V2 is provided to the third node C, that is, the electric potential of the third node C is pulled down.

It should be explained that, source electrodes and drain electrodes of all the switch transistors described above can be functionally exchanged according to particular signal transmission conditions, without particularly limited herein.

The above merely is to illustrate a structure of the second control module in the shift register by way of example. During specific implementation, the particular structure of the second control module is not limited to the structure provided by the embodiments of the present disclosure but can also be other structures well-known for those skilled in the art, without limited herein.

Particularly, in the shift register provided by the embodiments of the present disclosure, as illustrated in FIG. 5, the second output control module 5 includes a seventh phase inverter N7, an eighth phase inverter N8 and N output control sub-modules 51.

An input end of the seventh phase inverter N7 is connected to the third node C; an output end of the seventh phase inverter N7 is connected to one end of each of the N output control sub-modules 51 and an input end of the eighth phase inverter N8, respectively.

The input end of the eighth phase inverter N8 is connected to one end of each of the N output control sub-modules 51 and the output end of the seventh phase inverter N7, respectively; an output end of the eighth phase inverter N8 is connected the other end of each of the N output control sub-modules 51.

Each of the output control sub-modules 51 is configured to provide a reset signal outputted by the reset signal end RESET1 to one of the N second output ends corresponding to each of the output control sub-modules 51, under the control of an electric potential of the output end of the seventh phase inverter N7 and an electric potential of the output end of the eighth phase inverter N8; or is configured to provide a clock signal outputted by the $n^{th}$ third clock signal end to the $n^{th}$ second output end under the control of the electric potential of the output end of the seventh phase inverter N7 and the electric potential of the output end of the eighth phase inverter N8.

In specific implementation, the seventh phase inverter N7 outputs the electric potential of the third node C in a reverse phase manner, and provides the signal as outputted to the input end of the eighth phase inverter N8 and the N output control sub-modules; the eighth phase inverter N8, in turn, outputs the signal outputted by the seventh phase inverter N7 in a reverse phase manner, and also provides the signal outputted by the eighth phase inverter N8 to the N output control sub-modules. By providing the signal outputted by the seventh phase inverter N7 and the signal outputted by the eighth phase inverter N8 to the N output control sub-modules, it can control the N output control sub-modules to provide the reset signal outputted by the reset signal end RESET1 to one of the N second output ends corresponding to each of the output control sub-modules, or to provide the clock signal sent by the $n^{th}$ third clock signal end to the $n^{th}$ second output end.

The above merely is to illustrate a structure of the second output control module in the shift register by way of example. During specific implementation, the particular structure of the second output control module is not limited to the structure provided by the embodiments of the present disclosure but can also be other structures well-known for those skilled in the art, without limited herein.

In the shift register provided by the embodiments of the present disclosure, as illustrated in FIG. 5, the $1^{st}$ output control sub-module 51 may include a fifth transmission gate TG5, a sixth transmission gate TG6, a ninth phase inverter N9 and a tenth phase inverter N10.

An input end of the fifth transmission gate TG5 is connected to the reset signal end RESET1; an output end of the fifth transmission gate TG5 is connected to an input end of the ninth phase inverter N9; a positive phase control end of the fifth transmission gate TG5 is connected to the output end of the seventh phase inverter N7; a reverse phase control end of the fifth transmission gate TG5 is connected to the output end of the eighth phase inverter N8.

An input end of the sixth transmission gate TG6 is connected to the $1^{st}$ third clock signal end CK1 among the N third clock signal ends; an output end of the sixth transmission gate TG6 is connected to an input end of the ninth phase inverter N9; a reverse phase control end of the sixth transmission gate TG6 is connected to the output end of the seventh phase inverter N7; a positive phase control end of the sixth transmission gate TG6 is connected to the output end of the eighth phase inverter N8.

An input end of the ninth phase inverter N9 is connected to an output end of the fifth transmission gate TG5 and an output end of the sixth transmission gate TG6, respectively; an output end of the ninth phase inverter N9 is connected to an input end of a tenth phase inverter N10.

The input end of the tenth phase inverter N10 is connected to the output end of the ninth phase inverter N9; an output end of the tenth phase inverter N10 is connected to the $1^{st}$ second output end OUT21 among the N second output ends.

In specific implementation, when the output end of the seventh phase inverter N7 is at high level and when the output end of the eighth phase inverter N8 is at low level, the positive phase control end of the sixth transmission gate TG6 is at low level, the reverse phase control end of the sixth transmission gate TG6 is at high level, and the sixth transmission gate TG6 is cut off; at this time, the positive phase control end of the fifth transmission gate TG5 is at high level while the reverse phase control end of the fifth transmission gate TG5 is at low level, the fifth transmission gate TG5 is turned on, the reset signal sent by the reset signal end RESET1 is provided to the input end of the ninth phase inverter N9 through the turned on, fifth transmission gate TG5, and is provided to a corresponding second output end OUT21 through the ninth phase inverter N9 and the tenth phase inverter N10; when the output end of the seventh phase inverter N7 is at low level, the output end of the eighth phase inverter N8 is at high level, the positive phase control end of the fifth transmission gate TG5 is at low level, the reverse phase control end of the fifth transmission gate TG5 is at high level, and the fifth transmission gate TG5 is cut off; at this time, the positive phase control end of the sixth transmission gate TG6 is at high level, the reverse phase control end of the sixth transmission gate TG6 is at low level, the sixth transmission gate TG6 is turned on, the third clock signal sent by the third clock signal end CK1 is provided to the input end of the ninth phase inverter N9 through the turned on, sixth transmission gate TG6, and is provided to a corresponding second output end OUT21 through the ninth phase inverter N9 and the tenth phase inverter N10.

As illustrated in FIG. 5, the $2^{nd}$ output control sub-module 51 includes a seventh transmission gate TG7, an eighth transmission gate TG8, an eleventh phase inverter N11 and a twelfth phase inverter N12.

An input end of the seventh transmission gate TG7 is connected to the reset signal end RESET1; an output end of the seventh transmission gate TG7 is connected to an input end of the eleventh phase inverter N11; a positive phase control end of the seventh transmission gate TG7 is connected to the output end of the seventh phase inverter N7; and a reverse phase control end of the seventh transmission gate TG7 is connected to the output end of the eighth phase inverter N8.

An input end of the eighth transmission gate TG8 is connected to the $2^{nd}$ third clock signal end CK2 among the N third clock signal ends; an output end of the eighth transmission gate TG8 is connected to an input end of the eleventh phase inverter N11; a reverse phase control end of the eighth transmission gate TG8 is connected to the output end of the seventh phase inverter N7; and a positive phase control end of the eighth transmission gate TG8 is connected to the output end of the eighth phase inverter N8.

An input end of the eleventh phase inverter N11 is connected to an output end of the seventh transmission gate TG7 and an output end of the eighth transmission gate TG8, respectively; an output end of the eleventh phase inverter N11 is connected to an input end of the twelfth phase inverter N12.

The input end of the twelfth phase inverter N12 is connected to the output end of the eleventh phase inverter N11; an output end of the twelfth phase inverter N12 is connected to the $2^{nd}$ second output end OUT22 among the N second output ends.

In specific implementation, when the output end of the seventh phase inverter N7 is at high level and the output end of the eighth phase inverter N8 is at low level, the positive phase control end of the eighth transmission gate TG8 is at low level, the reverse phase control end of the eighth transmission gate TG8 is at high level, and the eighth transmission gate TG8 is cut off. At the same time, the positive phase control end of the seventh transmission gate TG7 is at high level while the reverse phase control end of the seventh transmission gate TG7 is at low level, the seventh transmission gate TG7 is turned on, the reset signal sent by the reset signal end RESET1 is provided to the input end of the eleventh phase inverter N11 through the turned on, seventh transmission gate TG7, and is provided to a corresponding second output end OUT22 through the eleventh phase inverter N11 and the twelfth phase inverter N12. When the output end of the seventh phase inverter N7 is at low level, the output end of the eighth phase inverter N8 is at high level, the positive phase control end of the seventh transmission gate TG7 is at low level, the reverse phase control end of the seventh transmission gate TG7 is at high level, and the seventh transmission gate TG7 is cut off. At the same time, the positive phase control end of the eighth transmission gate TG8 is at high level, the reverse phase control end of the eighth transmission gate TG8 is at low level, the eighth transmission gate TG8 is turned on, the third clock signal sent by the third clock signal end CK2 is provided to the input end of the eleventh phase inverter N11 through the turned on, eighth transmission gate TG8, and is provided to a corresponding second output end OUT22 through the eleventh phase inverter N11 and the twelfth phase inverter N12.

As illustrated in FIG. 5, the $3^{rd}$ output control sub-module 51 includes a ninth transmission gate TG9, a tenth transmission gate TG10, a thirteenth phase inverter N13 and a fourteenth phase inverter N14.

An input end of the ninth transmission gate TG9 is connected to the reset signal end RESET1; an output end of the ninth transmission gate TG9 is connected to an input end of the thirteenth phase inverter N13; a positive phase control end of the ninth transmission gate TG9 is connected to the output end of the seventh phase inverter N7; a reverse phase control end of the ninth transmission gate TG9 is connected to the output end of the eighth phase inverter N8.

An input end of the tenth transmission gate TG10 is connected to the $3^{rd}$ third clock signal end CK3 among the N third clock signal ends; an output end of the tenth transmission gate TG10 is connected to an input end of the thirteenth phase inverter N13; a reverse phase control end of the tenth transmission gate TG10 is connected to the output end of the seventh phase inverter N7; a positive phase control end of the tenth transmission gate TG10 is connected to the output end of the eighth phase inverter N8.

An input end of the thirteenth phase inverter N13 is connected to an output end of the ninth transmission gate TG9 and an output end of the tenth transmission gate TG10, respectively; an output end of the thirteenth phase inverter N13 is connected to an input end of the fourteenth phase inverter N14.

The input end of the fourteenth phase inverter N14 is connected to the output end of the thirteenth phase inverter N13; an output end of the fourteenth phase inverter N14 is connected to the $3^{rd}$ second output end OUT23 among the N second output ends.

In specific implementation, when the output end of the seventh phase inverter N7 is at high level and when the output end of the eighth phase inverter N8 is at low level, the positive phase control end of the tenth transmission gate TG10 is at low level, the reverse phase control end of the tenth transmission gate TG10 is at high level, and the tenth transmission gate TG10 is cut off; at this time, the positive phase control end of the ninth transmission gate TG9 is at high level, the reverse phase control end of the ninth transmission gate TG9 is at low level, the ninth transmission gate TG9 is turned on, the reset signal sent by the reset signal end RESET1 is provided to the input end of the thirteenth phase inverter N13 through the turned on, ninth transmission gate TG9, and is provided to a corresponding second output end OUT23 through the thirteenth phase inverter N13 and the fourteenth phase inverter N14; when the output end of the seventh phase inverter N7 is at low level, the output end of the eighth phase inverter N8 is at high level, the positive phase control end of the ninth transmission gate TG9 is at low level, the reverse phase control end of the ninth transmission gate TG9 is at high level, and the ninth transmission gate TG9 is cut off; at this time, the positive phase control end of the tenth transmission gate TG10 is at high level, the reverse phase control end of the tenth transmission gate TG10 is at low level, the tenth transmission gate TG10 is turned on, the third clock signal sent by the third clock signal end CK3 is provided to the input end of the thirteenth phase inverter N13 through the turned on, tenth transmission gate TG10, and is provided to a corresponding second output end OUT23 through the thirteenth phase inverter N13 and the fourteenth phase inverter N14.

As illustrated in FIG. 5, the $4^{th}$ output control sub-module 51 includes an eleventh transmission gate TG11, a twelfth transmission gate TG12, a fifteenth phase inverter N15 and a sixteenth phase inverter N16.

An input end of the eleventh transmission gate TG11 is connected to the reset signal end RESET1; an output end of the eleventh transmission gate TG11 is connected to an input end of the fifteenth phase inverter N15; a positive phase control end of the eleventh transmission gate TG11 is connected to the output end of the seventh phase inverter N7; a reverse phase control end of the eleventh transmission gate TG11 is connected to the output end of the eighth phase inverter N8.

An input end of the twelfth transmission gate TG12 is connected to the $4^{th}$ third clock signal end CK4 among the N third clock signal ends; an output end of the twelfth transmission gate TG12 is connected to an input end of the fifteenth phase inverter N15; a reverse phase control end of the twelfth transmission gate TG12 is connected to the output end of the seventh phase inverter N7; a positive phase control end of the twelfth transmission gate TG12 is connected to the output end of the eighth phase inverter N8.

An input end of the fifteenth phase inverter N15 is connected to an output end of the eleventh transmission gate TG11 and an output end of the twelfth transmission gate TG12, respectively; an output end of the fifteenth phase inverter N15 is connected to an input end of the sixteenth phase inverter N16.

The input end of the sixteenth phase inverter N16 is connected to the output end of the fifteenth phase inverter N15; an output end of the sixteenth phase inverter N16 is connected to the $4^{th}$ second output end OUT24 among the N second output ends.

In specific implementation, when the output end of the seventh phase inverter N7 is at high level and when the output end of the eighth phase inverter N8 is at low level, the positive phase control end of the twelfth transmission gate TG12 is at low level, the reverse phase control end of the twelfth transmission gate TG12 is at high level, and the twelfth transmission gate TG12 is cut off; at this time, the positive phase control end of the eleventh transmission gate TG11 is at high level, the reverse phase control end of the eleventh transmission gate TG11 is at low level, the eleventh transmission gate TG11 is turned on, the reset signal sent by the reset signal end RESET1 is provided to the input end of the fifteenth phase inverter N15 through the turned on, eleventh transmission gate TG11, and is provided to a corresponding second output end OUT24 through the fifteenth phase inverter N15 and the sixteenth phase inverter N16; when the output end of the seventh phase inverter N7 is at low level, the output end of the eighth phase inverter N8 is at high level, the positive phase control end of the eleventh transmission gate TG11 is at low level, the reverse phase control end of the eleventh transmission gate TG11 is at high level, and the eleventh transmission gate TG11 is cut off; at this time, the positive phase control end of the twelfth transmission gate TG12 is at high level, the reverse phase control end of the twelfth transmission gate TG12 is at low level, the twelfth transmission gate TG12 is turned on, the third clock signal sent by the third clock signal end CK4 is provided to the input end of the fifteenth phase inverter N15 through the turned on, twelfth transmission gate TG12, and is provided to a corresponding second output end OUT24 through the fifteenth phase inverter N15 and the sixteenth phase inverter N16.

In the shift register provided by the embodiments of the present disclosure, as an example, N is equal to 4. That is to say, the shift register described above includes four output control sub-modules, so as to realize four-stage output through one-state input.

It should be explained that, N being equal to 4 is merely one of exemplary embodiments in which N is a positive integer greater than or equal to 1, and the specific value of N may be determined according to actual conditions without particularly limited herein.

The above merely is to illustrate a structure of the output control sub-module in the shift register by way of example. During specific implementation, the particular structure of the output control sub-module is not limited to the structure provided by the embodiments of the present disclosure but can also be other structures well-known for those skilled in the art, without limited herein.

Hereinafter, the working process of forward scanning performed by the shift register of the embodiments of the present disclosure will be described through specific embodiments in conjunction with time sequence diagrams. In the description below, the high level signal is denoted by 1 and the low level signal is denoted by 0.

Figure 6:
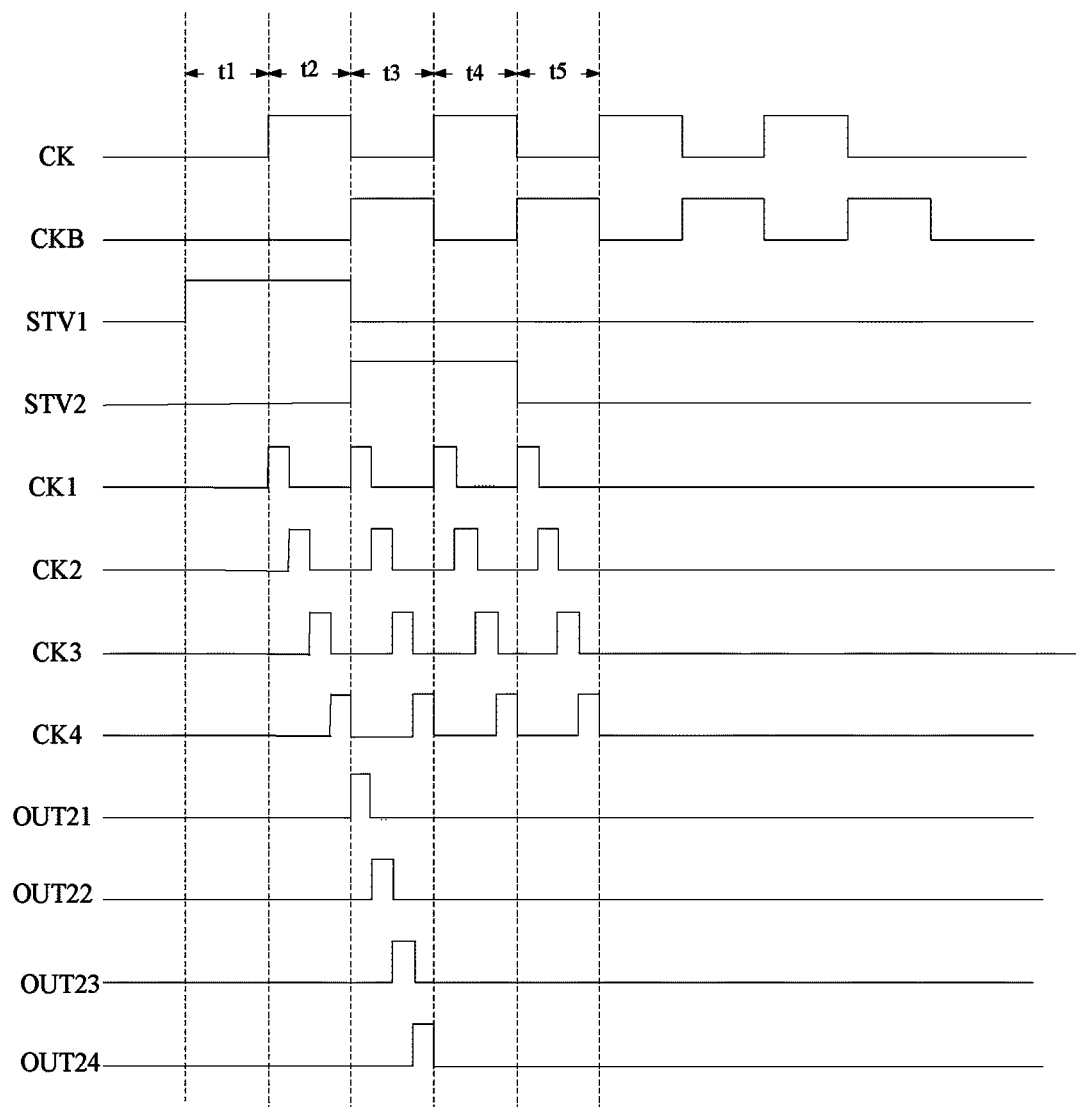
FIG. 6 is a circuit sequence diagram of a shift register provided by an embodiment of the present disclosure.

For the shift register illustrated in FIG. 3 and FIG. 5, by way of example, the working sequence diagram thereof is illustrated in FIG. 6, including five phases of t1, t2, t3, t4 and t5. Given that CNB=0 and CN=1 by way of example, each of CK1, CK2, CK3 and CK4 takes a high level signal as an effective signal, and CK1 starts to output when the first clock signal CK outputs a high level, followed by the output of CK2, CK3 and CK4, sequentially.

At the time period t1, STV1=1, STV2=0, CK=0, CKB=0.

Since STV1=1 and STV2=0, the NOR gate NA outputs a low level signal; at this time, the first switch transistor T1 is cut off, the electric potential of the positive phase control end of the first transmission gate TG1 is at high level, the electric potential of the reverse phase control end of the first transmission gate TG1 is at low level, the first transmission gate TG1 is turned on, and the first clock signal CK is transmitted to the first node A through the turned on, first transmission gate TG1; since the first clock signal CK is a low level signal, the second switch transistor T2 is cut off, the signal of the second node B cannot be transmitted to the first output end OUT1; at this time, the first output end OUT1 maintains at low level, thus the positive phase control end of the fourth transmission gate TG4 is at low level and the reverse phase control end of the fourth transmission gate TG4 is at high level, the fourth transmission gate TG4 is cut off, and the second clock signal CKB cannot be transmitted to the third node C; whereas, the gate electrode of the fifth switch transistor T5 is at high level, the fifth switch transistor T5 is turned on, and the electric potential of the third node C is pulled down to be at low level; at this time, the output end of the seventh phase inverter N7 is at high level, and the output end of the eighth phase inverter N8 is at low level; that is, the positive phase control end of the fifth transmission gate TG5 is at high level, and reverse phase control ends of the fifth transmission gate TG5, the seventh transmission gate TG7, the ninth transmission gate TG9 and the eleventh transmission gate TG11 each are at low level, the fifth transmission gate TG5, the seventh transmission gate TG7, the ninth transmission gate TG9 and the eleventh transmission gate TG11 are all turned on; correspondingly, the sixth transmission gate TG6, the eighth transmission gate TG8, the tenth transmission gate TG10 and the twelfth transmission gate TG12 are all cut off; the reset signal RESET1 is outputted to a corresponding second output end through the turned on, fifth transmission gate TG5, seventh transmission gate TG7, ninth transmission gate TG9 and eleventh transmission gate TG11; at this time, the reset signal RESET1 is a low level signal.

At the time period t2, STV1=1, STV2=0, CK=1, CKB=0.

Since STV1=1 and STV2=0, the NOR gate NA outputs a low level signal; at this time, the first switch transistor T1 is cut off, the electric potential of the positive phase control end of the first transmission gate TG1 is at high level, the electric potential of the reverse phase control end of the first transmission gate TG1 is at low level, the first transmission gate TG1 is turned on, and the first clock signal is transmitted to the first node A through the turned on, first transmission gate TG1; since the first clock signal is a high level signal, the second switch transistor T2 is turned on, the third switch transistor T3 is cut off, the signal of the second node B is transmitted to the input end of the third phase inverter N3 through the turned on, second switch transistor T2, and is transmitted to the input end of the fifth phase inverter N5 through the third phase inverter N3, and then is provided to the first output end OUT1 through a reversal process of the fifth phase inverter N5; since the electric potential of the first output end OUT1 is at high level, the positive phase control end of the fourth transmission gate TG4 is at high level, the reverse phase control end of the fourth transmission gate TG4 is at low level, the fourth transmission gate TG4 is turned on, the fifth switch transistor T5 is cut off, the second clock signal CKB is transmitted to the third node C through the turned on, fourth transmission gate TG4, in which the second clock signal CKB is at low level; at this time, the output end of the seventh phase inverter N7 is at high level, the output end of the eighth phase inverter N8 is at low level, that is, positive phase control ends of the fifth transmission gate TG5, the seventh transmission gate TG7, the ninth transmission gate TG9 and the eleventh transmission gate TG11 each are at low level, the fifth transmission gate TG5, the seventh transmission gate TG7, the ninth transmission gate TG9 and the eleventh transmission gate TG11 are all turned on; correspondingly, the sixth transmission gate TG6, the eighth transmission gate TG8, the tenth transmission gate TG10 and the twelfth transmission gate TG12 are all cut off; the reset signal RESET1 is outputted to a corresponding second output end through the turned on, fifth transmission gate TG5, seventh transmission gate TG7, ninth transmission gate TG9 and eleventh transmission gate TG11; at this time, the reset signal is a low level signal.

At the time period t3, STV1=0, STV2=1, CK=0, CKB=1.

Since STV1=0 and STV2=1, the NOR gate NA outputs a low level signal; at this time, the first switch transistor T1 is cut off, the electric potential of the positive phase control end of the first transmission gate TG1 is at high level, the electric potential of the reverse phase control end of the first transmission gate TG1 is at low level, the first transmission gate TG1 is turned on, and the first clock signal CK is transmitted to the first node A through the turned on, first transmission gate TG1; since the first clock signal CK is a low level signal, the second switch transistor T2 is cut off, and the third switch transistor T3 is turned on; at this time, the third switch transistor T3, the third phase inverter N3 and the fourth phase inverter N4 are connected end to end to form a closed-loop structure, which allows the electric potential of each of the ends to maintain at a state of the previous phase until entering the next phase; since the output end of the third phase inverter N3 is at low level during the time period t2, it's still at low level during the time period t3 and transmits the low level to the input end of the fifth phase inverter N5; the low level is subjected to a reversal process by the fifth phase inverter N5 and then is provided to the first output end OUT1 as a high level; since the electric potential of the first output end OUT1 is at high level, the positive phase control end of the fourth transmission gate TG4 is at high level, the reverse phase control end of the fourth transmission gate TG4 is at low level, the fourth transmission gate TG4 is turned on, the switch transistor T5 is cut off, and the second clock signal CKB is transmitted to the third node C through the turned on, fourth transmission gate TG4, in which the second clock signal CKB is a high level signal; at this time, the output end of the seventh phase inverter N7 is at low level, and the output end of the eighth phase inverter N8 is at high level.

That is, the positive phase control end of the sixth transmission gate TG6 is at high level, the reverse phase control end of the sixth transmission gate TG6 is at low level, and the sixth transmission gate TG6 is turned on; correspondingly, the fifth transmission gate TG5 is cut off, CK1 is outputted to the second output end OUT21 through the turned on, sixth transmission gate TG6; the positive phase control end of the eighth transmission gate TG8 is at high level, the reverse phase control end of the eighth transmission gate TG8 is at low level, and the eighth transmission gate TG8 is turned on; correspondingly, the seventh transmission gate TG7 is cut off, CK2 is outputted to the second output end OUT22 through the turned on, eighth transmission gate TG8; the positive phase control end of the tenth transmission gate TG10 is at high level, the reverse phase control end of the tenth transmission gate TG10 is at low level, and the tenth transmission gate TG10 is turned on; correspondingly, the ninth transmission gate TG9 is cut off, CK3 is outputted to the second output end OUT23 through the turned on, tenth transmission gate TG10; the positive phase control end of the twelfth transmission gate TG12 is at high level, the reverse phase control end of the twelfth transmission gate TG12 is at low level, and the twelfth transmission gate TG12 is turned on; correspondingly, the eleventh transmission gate TG11 is cut off, CK4 is outputted to the second output end OUT24 through the turned on, twelfth transmission gate TG12.

At the time period t4, STV1=0, STV2=1, CK=1, CKB=0.

Since STV1=0 and STV2=1, the NOR gate NA outputs a low level signal; at this time, the first switch transistor T1 is cut off, the electric potential of the positive phase control end of the first transmission gate TG1 is at high level, the electric potential of the reverse phase control end of the first transmission gate TG1 is at low level, the first transmission gate TG1 is turned on, and the first clock signal CK is transmitted to the first node A through the turned on, first transmission gate TG1; since the first clock signal CK is a high level signal, the second switch transistor T2 is turned on, the third switch transistor T3 is cut off, the signal of the second node B is transmitted to the input end of the third phase inverter N3 through the turned on, second switch transistor T2, in which the electric potential of the second node B is at low level; the signal of the second node B is transmitted to the input end of the fifth phase inverter N5 through the third phase inverter N3, and then is provided to the first output end OUT1 through a reversal process of the fifth phase inverter N5; since the electric potential of the first output end OUT1 is at low level, the positive phase control end of the fourth transmission gate TG4 is at low level, the reverse phase control end of the fourth transmission gate TG4 is at high level, the fourth transmission gate TG4 is cut off, the fifth switch transistor T5 is turned on, the second clock signal CKB cannot be transmitted to the third node C through the cut off, fourth transmission gate TG4, and the fifth switch transistor T5 pulls down the electric potential of the third node C; at this time, the output end of the seventh phase inverter N7 is at high level, the output end of the eighth phase inverter N8 is at low level, that is, positive phase control ends of the fifth transmission gate TG5, the seventh transmission gate TG7, the ninth transmission gate TG9 and the eleventh transmission gate TG1 each are at high level, reverse phase control ends of the fifth transmission gate TG5, the seventh transmission gate TG7, the ninth transmission gate TG9 and the eleventh transmission gate TG11 each are at low level, and the fifth transmission gate TG5, the seventh transmission gate TG7, the ninth transmission gate TG9 and the eleventh transmission gate TG11 are all turned on; correspondingly, the sixth transmission gate TG6, the eighth transmission gate TG8, the tenth transmission gate TG10 and the twelfth transmission gate TG12 are all cut off, and the reset signal RESET1 is outputted to a corresponding second output end through the turned on, fifth transmission gate TG5, seventh transmission gate TG7, ninth transmission gate TG9 and eleventh transmission gate TG11; at this time, the reset signal RESET1 is a low level signal.

At the time period t5, STV1=0, STV2=0, CK=0, CKB=1.

Since STV1=0 and STV2=0, the NOR gate NA outputs a high level signal; at this time, the first switch transistor T1 is turned on, the electric potential of the positive phase control end of the first transmission gate TG1 is at low level, the electric potential of the reverse phase control end of the first transmission gate TG1 is at high level, the first transmission gate TG1 is cut off, and the first clock signal CK cannot be transmitted through the first transmission gate TG1; at this time, turning on the first switch transistor T1 pulls down the electric potential of the first node A, thus the second switch transistor T2 is cut off, the signal of the second node B cannot be transmitted to the first output end OUT1, and the third switch transistor T3 is turned on; at this time, the third switch transistor T3, the third phase inverter N3 and the fourth phase inverter N4 are connected end to end to form a closed-loop structure, which allows the electric potential of each of the ends to maintain at a state of the previous phase until entering the next phase; at this time, the first output end OUT1 maintains at the low level of the previous phase, thus the positive phase control end of the fourth transmission gate TG4 is at low level, the reverse phase control end of the fourth transmission gate TG4 is at high level, the fourth transmission gate TG4 is cut off, and the second clock signal CKB cannot be transmitted to the third node C; whereas, the gate electrode of the fifth switch transistor T5 is at high level, the fifth switch transistor T5 is turned on, which pulls the electric potential of the third node C to be at low level; at this time, the output end of the seventh phase inverter N7 is at high level, and the output end of the eighth phase inverter N8 is at low level, that is, positive phase control ends of the fifth transmission gate TG5, the seventh transmission gate TG7, the ninth transmission gate TG9 and the eleventh transmission gate TG11 each are at high level, reverse phase control ends of the fifth transmission gate TG5, the seventh transmission gate TG7, the ninth transmission gate TG9 and the eleventh transmission gate TG11 each are at low level, and the fifth transmission gate TG5, the seventh transmission gate TG7, the ninth transmission gate TG9 and the eleventh transmission gate TG11 are all turned on; correspondingly, the sixth transmission gate TG6, the eighth transmission gate TG8, the tenth transmission gate TG10 and the twelfth transmission gate TG12 are all cut off; the reset signal RESET1 is outputted to a corresponding second output end through the turned on, fifth transmission gate TG5, seventh transmission gate TG7, ninth transmission gate TG9 and eleventh transmission gate TG11; at this time, the reset signal RESET1 is a low level signal.

The above is described with reference to the case where the shift register performs forward scanning by way of example, but the shift register is also applicable for a process of reverse scanning, in which CNB=1, CN=0, an output signal of a next stage is an input signal of a previous stage. Particular steps are similar to those in the described forward scanning process, and details thereof will be omitted herein.

Figure 7:
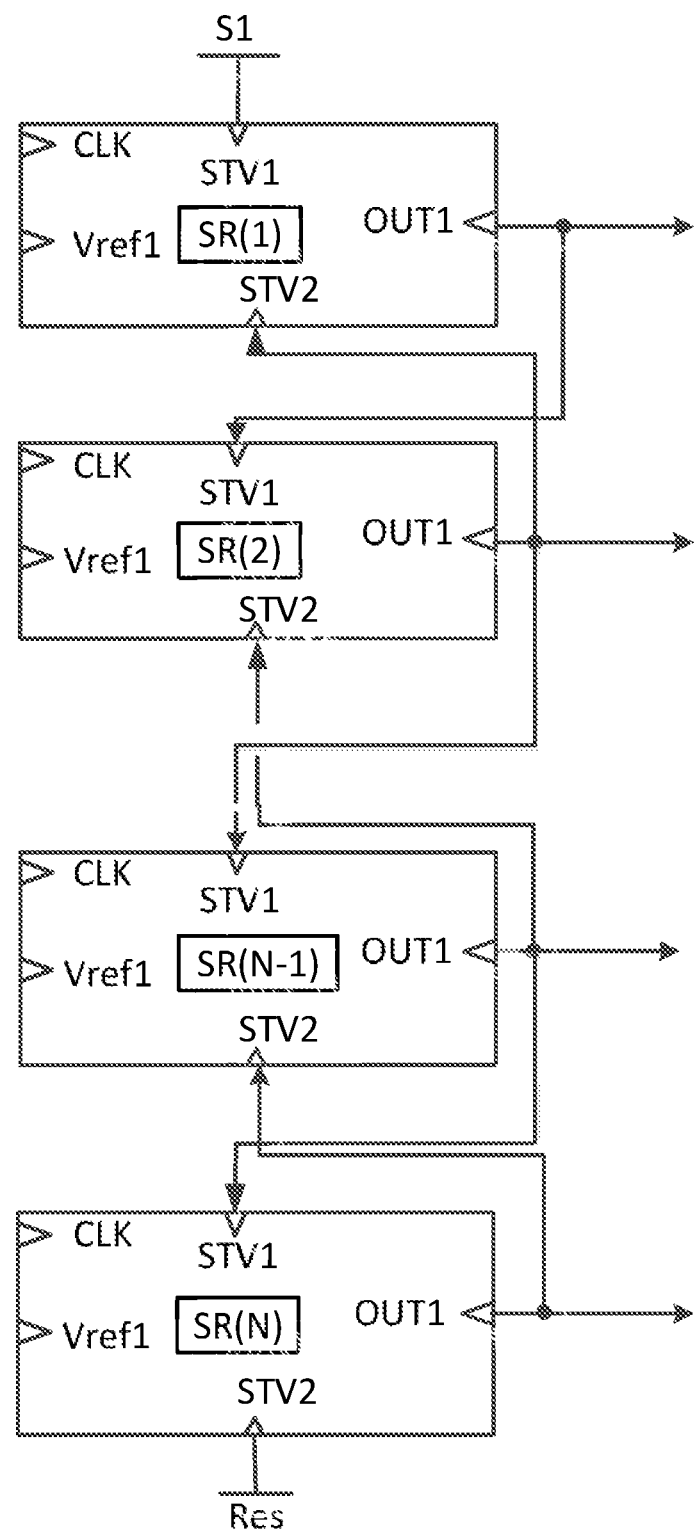
FIG. 7 is a structural diagram of a gate driver circuit provided by an embodiment of the present disclosure.

Based on the same inventive concept, as illustrated in FIG. 7, embodiments of the present disclosure further provide a gate driver circuit including a plurality of cascaded shift registers. In the gate driver circuit:

except for a first stage of shift register SR(1), the first signal input end STV1 of each of the rest stages of shift registers SR(2)-SR(N) is connected to the first output end OUT1 of a previous stage of shift register as cascaded; and except for a last stage of shift register SR(N), the second signal input end STV2 of each of the rest stages of shift registers SR(1)-SR(N−1) is connected to the first output end OUT1 of a next stage of shift register as cascaded.

Further, the first signal input end STV1 of the first stage of shift register SR(1) is connected to a frame triggering signal end S1;

the second signal input end STV2 of the last stage of shift register SR(N) is connected to a frame ending signal end Res.

Particularly, each of the shift registers in the above-mentioned gate driver circuit is functionally and structurally similar with the previously described shift register of the present disclosure, and the details thereof will be omitted herein.

Based on the same inventive concept, embodiments of the present disclosure further provide a driving method of a shift register, including:

in a first time period, providing a high level signal to the first signal input end, providing a low level signal to the second signal input end, and providing a low level signal to the first clock signal end, the first output end outputting a low level signal;

in a second time period, providing a high level signal to the first signal input end, providing a low level signal to the second signal input end, and providing a high level signal to the first clock signal end, the first output end outputting a high level signal;

in a third time period, providing a low level signal to the first signal input end, providing a high level signal to the second signal input end, and providing a low level signal to the first clock signal end, the first output end outputting a high level signal;

in a fourth time period, providing a low level signal to the first signal input end, providing a high level signal to the second signal input end, and providing a high level signal to the first clock signal end, the first output end outputting a low level signal; and in a fifth time period, providing a low level signal to the first signal input end, providing a low level signal to the second signal input end, and providing a low level signal to the first clock signal end, the first output end outputting a low level signal.

Further, when the shift register includes a second control module and a second output control module, the driving method provided by the embodiments of the present disclosure further includes:

in the first time period, providing a high level signal to the second clock signal, and providing a low level signal to the reset signal end, the N second output ends all outputting low level signals;

in the second time period, providing a low level signal to the second clock signal, providing a low level signal to the reset signal end, and providing a high level signal sequentially to the N third clock signal ends, the N second output ends all outputting low level signals;

in the third time period, providing a high level signal to the second clock signal, providing a low level signal to the reset signal end, and providing a high level signal sequentially to the N third clock signal ends, the N second output ends sequentially outputting high level signals identical with signals provided by the N third clock signal ends respectively;

in the fourth time period, providing a low level signal to the second clock signal, providing a low level signal to the reset signal end, and providing a high level signal sequentially to the N third clock signal ends, the N second output ends all outputting low level signals; and in the fifth time period, providing a high level signal to the second clock signal, providing a low level signal to the reset signal end, and providing a high level signal sequentially to the N third clock signal ends, the N second output ends all outputting low level signals.

The particular process of the driving method has been described in details in the embodiments of the shift register, and the details thereof will not be repeated herein.

Based on the same inventive concept, embodiments of the present disclosure further provide a display device including the gate driver circuit described above. By means of the gate driver circuit, the scanning signal can be provided to the gate lines on the array substrate in the display device. The specific implementation can be referred to the description of the gate driver circuit in the above, and the details thereof will not be repeated herein.

Embodiments of the present disclosure provide the shift register, the driving method thereof, the gate driver circuit and the display device above. The shift register includes a first control module, a scanning control module and a first output control module. The first control module is configured to provide a first clock signal outputted by the first clock signal end to the first node if at least one of impulse signals inputted by the first signal input end and the second signal input end is a high level pulse signal, or, to provide a first voltage signal outputted by the first voltage signal end to the first node if both of the pulse signals inputted by the first signal input end and the first signal input end and the second signal input end are low level pulse signals. The scanning control module is configured to provide a signal of the first signal input end to the second node during forward scanning and to provide a signal of the second signal input end to the second node during reverse scanning. The first output control module is configured to output an electric potential of the second node to the first output end under the control of an electric potential of the first node. The arrangement of the above-mentioned modules simplifies the working process of the shift register; furthermore, the control for the first signal input end, the second signal input end and the modules allows the first clock signal end to output only two pulses during every scanning time for one row, which reduces a switching frequency and well lowers the power consumption.

Apparently, various modifications and variations may be made to the present disclosure by those skilled in the art without departing from the spirit and scope of the present disclosure. In this way, the present disclosure is intended to cover any modification and variation which falls within the scope of the appended claims and their equivalents of the present disclosure.

What is claimed is:

1. A shift register, comprising:
a first control module, connected to a first signal input end, a second signal input end, a first clock signal end, a first voltage signal end and a first node, respectively, wherein the first control module is configured to provide a first clock signal outputted by the first clock signal end to the first node if at least one of impulse signals inputted by the first signal input end and the second signal input end is a turned-on pulse signal, and to provide a first voltage signal outputted by the first voltage signal end to the first node if both of the pulse signals inputted by the first signal input end and the second signal input end are cut-off pulse signals;
a scanning control module, connected to the first signal input end, the second signal input end and a second node, respectively, wherein the scanning control module is configured to provide a signal of the first signal input end to the second node during forward scanning and to provide a signal of the second signal input end to the second node during reverse scanning;
a first output control module, connected to the first node, the second node and a first output end, respectively, wherein the first output control module is configured to output an electric potential of the second node to the first output end under the control of an electric potential of the first node;
a second control module, connected to the first output end, a second clock signal end, a third node and a second voltage signal end, respectively, wherein the second control module is configured to provide a second clock signal outputted by the second clock signal end or a second voltage signal outputted by the second voltage signal end to the third node under the control of an electric potential of the first output end; and
a second output control module, connected to the third node, a reset signal end, N third clock signal ends and N second output ends, respectively, wherein the second output control module is configured to provide a reset signal outputted by the reset signal end to the N second output ends under the control of an electric potential of the third node, or to provide a clock signal outputted but a $n^{th}$ third mode, where N is a positive integer greater than or equal to 1, the $n^{th}$ second output end belongs to the N second output ends;

wherein a phase of the first clock signal is opposite to a phase of the second clock signal; a clock period of a clock signal outputted by each of the third clock signal ends is equal to ½ of a clock period of the first clock signal; a duty cycle if the clock signal outputted by each of the third clock signal is 1/N; and when the first clock signal starts to output a high level pulse signal, phases of clock signals outputted by a $1^{st}$ third clock signal end to a $N^{th}$ third clock signal end are sequentially delayed by $2\pi/N$.

2. The shift register according to claim 1, wherein the first control module comprises:
    a NOR gate, wherein an input end of the NOR gate is connected to the first signal input end and the second signal input end, respectively, and an output end of the NOR gate is connected to an input end of a first phase inverter, a reverse phase control end of a first transmission gate and a gate electrode of a first switch transistor, respectively;
    the first phase inverter, wherein the input end of the first phase inverter is connected to the output end of the NOR gate, and an output end of the first phase inverter is connected to a positive phase control end of the first transmission gate;
    the first transmission gate, wherein an input end of the first transmission gate is connected to the first clock signal end, an output end of the first transmission gate is connected to the first node, a positive phase control end of the first transmission gate is connected to the output end of the first phase inverter, and the reverse phase control end of the first transmission gate is connected to the output end of the NOR gate; and
    the first switch transistor, wherein the gate electrode of the first switch transistor is connected to the output end of the NOR gate, a source electrode of the first switch transistor is connected to the first voltage signal end, and a drain electrode of the first switch transistor is connected to the first node, and wherein the first switch transistor is a N-type transistor.

3. The shift register according to claim 1, wherein the scanning control module comprises:
    a second transmission gate, wherein a reverse phase control end of the second transmission gate is connected to a third voltage signal end, a positive phase control end of the second transmission gate is connected to a fourth voltage signal end, an input end of the second transmission gate is connected to the first signal input end, and an output end of the second transmission gate is connected to the second node; and
    a third transmission gate, wherein a reverse phase control end of the third transmission gate is connected to the fourth voltage signal end, a positive phase control end of the third transmission gate is connected to the third voltage signal end, an input end of the third transmission gate is connected to the second signal input end, and an output end of the third transmission gate is connected to the second node.

4. The shift register according to claim 1, wherein the first output control module comprises:
    a second switch transistor, wherein a gate electrode of the second switch transistor is connected to the first node; a source electrode of the second switch transistor is connected to the second node;
    a second phase inverter, wherein an input end of the second phase inverter is connected to the first node; and
    a third switch transistor, wherein a gate electrode of the third switch transistor is connected to an output end of the second phase inverter, a drain electrode of the third switch transistor is connected to a drain electrode of the second switch transistor;
    wherein both of the second switch transistor and the third switch transistor are N-type transistors.

5. The shift register according to claim 4, wherein the first output control module further comprises:
    a third phase inverter, wherein an input end of the third phase inverter is connected to the drain electrode of the second switch transistor and the drain electrode of the third switch transistor, respectively;
    a fourth phase inverter, wherein an output end of the fourth phase inverter is connected to a source electrode of the third switch transistor; and
    a fifth phase inverter, wherein an input end of the fifth phase inverter is connected to an output end of the third phase inverter and an input end of the fourth phase inverter, respectively, and an output end of the fifth phase inverter is connected to the first output end.

6. The shift register according to claim 5, further comprising:
    a fourth switch transistor, wherein a gate electrode of the fourth switch transistor is connected to the reset signal end; a source electrode of the fourth switch transistor is connected to a fifth voltage signal end; a drain electrode of the fourth switch transistor is connected to the input end of the fifth phase inverter, the output end of the third phase inverter and the output end of the fourth phase inverter, respectively;
    wherein the fourth switch transistor is a N-type transistor.

7. The shift register according to claim 1, wherein the second control module comprises:
    a fourth transmission gate, wherein an input end of the fourth transmission gate is connected to the second clock signal end; an output end of the fourth transmission gate is connected to the third node; a positive phase control end of the fourth transmission gate is connected to the first output end; a reverse phase control end of the fourth transmission gate is connected to an output end of a sixth phase inverter and a gate electrode of a fifth switch transistor, respectively;
    the sixth phase inverter, wherein an input end of the sixth phase inverter is connected to the first output end; the output end of the sixth phase inverter is connected to the reverse phase control end of the fourth transmission end and the gate electrode of the fifth switch transistor, respectively; and
    the fifth switch transistor, wherein the gate electrode of the fifth switch transistor is connected to the output end of the sixth phase inverter and the reverse phase control end of the fourth transmission gate, respectively; a source electrode of the fifth switch transistor is connected to the third node; a drain electrode of the fifth switch transistor is connected to the second voltage signal end;
    wherein the fifth switch transistor is a N-type transistor.

8. The shift register according to claim 7, wherein N is equal to 4.

9. The shift register according to claim 1, wherein the second output control module comprises:
    a seventh phase inverter, wherein an input end of the seventh phase inverter is connected to the third node; an output end of the seventh phase inverter is connected to one end of each of N output control sub-modules and an input end of an eighth phase inverter, respectively;
    the eighth phase inverter, wherein the input end of the eighth phase inverter is connected to one end of each of the N output control sub-modules and the output end of the seventh phase inverter, respectively; an output end of the eighth phase inverter is connected the other end of each of the N output control sub-modules; and the N output control sub-modules, wherein each of the output control sub-modules is configured to provide a reset signal outputted by the reset signal end to a corresponding one of the N second output ends under the control of an electric potential of the output end of the seventh phase inverter and an electric potential of the output end of the eighth phase inverter; or each of the output control sub-modules is configured to provide a clock signal outputted by a $n^{th}$ third clock signal end to a $n^{th}$ second output end under the control of the electric potential of the output end of the seventh phase inverter and the electric potential of the output end of the eighth phase inverter.

10. The shift register according to claim 9, wherein the output control sub-module comprises:

a fifth transmission gate, wherein an input end of the fifth transmission gate is connected to the reset signal end; a positive phase control end of the fifth transmission gate is connected to the output end of the seventh phase inverter; a reverse phase control end of the fifth transmission gate is connected to the output end of the eighth phase inverter; and a sixth transmission gate, wherein an input end of the sixth transmission gate is connected to the N third clock signal ends; a reverse phase control end of the sixth transmission gate is connected to the output end of the seventh phase inverter; a positive phase control end of the sixth transmission gate is connected to the output end of the eighth phase inverter.

11. The shift register according to claim 10, wherein the output control sub-module further comprises:

a ninth phase inverter, wherein an input end of the ninth phase inverter is connected to an output end of the fifth transmission gate and an output end of the sixth transmission gate, respectively, and an output end of the ninth phase inverter is connected to an input end of a tenth phase inverter; and the tenth phase inverter, wherein the input end of the tenth phase inverter is connected to the output end of the ninth phase inverter, and an output end of the tenth phase inverter is connected to the second output end.

12. A gate driver circuit, comprising a plurality of cascaded shift registers each according to claim 1, except for a first stage of shift register, the first signal input end of each of the rest stages of shift registers being connected to the first output end of a previous stage of shift register as cascaded; and except for a last stage of shift register, the second signal input end of each of the rest stages of shift registers being connected to the first output end of a next stage of shift register as cascaded.

13. The gate driver circuit according to claim 12, wherein the first signal input end of the first stage of shift register is connected to a frame triggering signal end; and the second signal input end of the last stage of shift register is connected to a frame ending signal end.

14. A display device, comprising the gate driver circuit according to claim 13.

15. A display device, comprising the gate driver circuit according to claim 12.

16. A driving method of a shift register according to claim 1, comprising:

in a first time period, providing a high level signal to the first signal input end, providing a low level signal to the second signal input end, and providing a low level signal to the first clock signal end, the first output end outputting the low level signal;

in a second time period, providing a high level signal to the first signal input end, providing a low level signal to the second signal input end, and providing a high level signal to the first clock signal end, the first output end outputting the high level signal;

in a third time period, providing a low level signal to the first signal input end, providing a high level signal to the second signal input end, and providing a low level signal to the first clock signal end, the first output end outputting the high level signal;

in a fourth time period, providing a low level signal to the first signal input end, providing a high level signal to the second signal input end, and providing a high level signal to the first clock signal end, the first output end outputting the low level signal; and in a fifth time period, providing a low level signal to the first signal input end, providing a low level signal to the second signal input end, and providing a low level signal to the first clock signal end, the first output end outputting the low level signal.

17. The driving method according to claim 16, wherein when the shift register comprises a second control module and a second output control module, the driving method further comprises:

in the first time period, providing a high level signal to the second clock signal, and providing a low level signal to the reset signal end, the N second output ends all outputting low level signals;

in the second time period, providing a low level signal to the second clock signal, providing a low level signal to the reset signal end, and providing a high level signal sequentially to N third clock signal ends, the N second output ends all outputting low level signals;

in the third time period, providing a high level signal to the second clock signal, providing a low level signal to the reset signal end, and providing a high level signal sequentially to the N third clock signal ends, the N second output ends sequentially outputting high level signals identical with signals provided by the N third clock signal ends respectively;

in the fourth time period, providing a low level signal to the second clock signal, providing a low level signal to the reset signal end, and providing a high level signal sequentially to the N third clock signal ends, the N second output ends all outputting low level signals; and in the fifth time period, providing a high level signal to the second clock signal, providing a low level signal to the reset signal end, and providing a high level signal sequentially to the N third clock signal ends, the N second output ends all outputting low level signals.

18. The shift register according to claim 1, wherein the first control module comprises:

a NOR gate, wherein an input end of the NOR gate is connected to the first signal input end and the second signal input end, respectively, and an output end of the NOR gate is connected to an input end of a first phase inverter, a reverse phase control end of a first transmission gate and a gate electrode of a first switch transistor, respectively;

a first phase inverter, wherein the input end of the first phase inverter is connected to the output end of the NOR gate, and an output end of the first phase inverter is connected to a positive phase control end of the first transmission gate;

a first transmission gate, wherein an input end of the first transmission gate is connected to the first clock signal end, an output end of the first transmission gate is connected to the first node, a positive phase control end of the first transmission gate is connected to the output end of the first phase inverter, and the reverse phase control end of the first transmission gate is connected to the output end of the NOR gate; and a first switch transistor, wherein the gate electrode of the first switch transistor is connected to the output end of the NOR gate, a source electrode of the first switch transistor is connected to the first voltage signal end, and a drain electrode of the first switch transistor is connected to the first node, and wherein the first switch transistor is a N-type transistor.

19. A shift register, comprising:

a first control module, connected to a first signal input end, a second signal input end, a first clock signal end, a first voltage signal end and a first node, respectively, wherein the first control module being configured to provide a first clock signal outputted by the first clock signal end to the first node if at least one of impulse signals inputted by the first signal input end and the second signal input end is a turned-on pulse signal, and to provide a first voltage signal outputted by the first voltage signal end to the first node if both of the pulse signals inputted by the first signal input end and the second signal input end are cut-off pulse signals;

a scanning control module, connected to the first signal input end, the second signal input end and a second node, respectively, wherein the scanning control module being configured to provide a signal of the first signal input end to the second node during forward scanning and to provide a signal of the second signal input end to the second node during reverse scanning;

a first output control module, connected to the first node, the second node and a first output end, respectively, wherein the first output control module being configured to output an electric potential of the second node to the first output end under the control of an electric potential of the first node;

a fourth switch transistor, a gate electrode of the fourth switch transistor being connected to a reset signal end, a source electrode of the fourth switch transistor being connected to a fifth voltage signal end, and a drain electrode of the fourth switch transistor being connected to an input end of a fifth phase inverter, an output end of a third phase inverter and an output end of a fourth phase inverter, respectively;

a second control module, connected to the first output end, a second clock signal end, a third node and a second voltage signal end, respectively, wherein the second control module being configured to provide a second clock signal outputted by the second clock signal end or a second voltage signal outputted by the second voltage signal end to the third node under the control of an electric potential of the first output end;

a second output control module, connected to the third node, the reset signal end, N third clock signal ends and N second output ends, respectively, wherein the second output control module being configured to provide a reset signal outputted by the reset signal end to the N second output ends under the control of an electric potential of the third node, or, to provide a clock signal outputted by a $n^{th}$ third clock signal end to a $n^{th}$ second output end under the control of the electric potential of the third node; and wherein N is a positive integer greater than or equal to 1, the $n^{th}$ second output end belongs to the N second output ends;

wherein a phase of the first clock signal is opposite to a phase of the second clock signal; a clock period of a clock signal outputted by each of the third clock signal ends is equal to ½ of a clock period of the first clock signal; a duty cycle of the clock signal outputted by the third clock signal ends is 1/N; when the first clock signal starts to output a high level pulse signal, phases of clock signals outputted by a $1^{st}$ third clock signal end to a $N^{th}$ third clock signal end are sequentially delayed by $2\pi/N$;

wherein the first control module comprises:

a NOR gate, wherein an input end of the NOR gate is connected to the first signal input end and the second signal input end, respectively; an output end of the NOR gate is connected to an input end of a first phase inverter, a reverse phase control end of a first transmission gate and a gate electrode of a first switch transistor, respectively;

the first phase inverter, wherein the input end of the first phase inverter is connected to the output end of the NOR gate; an output end of the first phase inverter is connected to a positive phase control end of the first transmission gate;

the first transmission gate, wherein an input end of the first transmission gate is connected to the first clock signal end, an output end of the first transmission gate is connected to the first node, a positive phase control end of the first transmission gate is connected to the output end of the first phase inverter, the reverse phase control end of the first transmission gate is connected to the output end of the NOR gate; and the first switch transistor, wherein the gate electrode of the first switch transistor is connected to the output end of the NOR gate, a source electrode of the first switch transistor is connected to the first voltage signal end, a drain electrode of the first switch transistor is connected to the first node;

wherein the scanning control module comprises:

a second transmission gate, wherein a reverse phase control end of the second transmission gate is connected to a third voltage signal end; a positive phase control end of the second transmission gate is connected to a fourth voltage signal end; an input end of the second transmission gate is connected to the first signal input end; an output end of the second transmission gate is connected to the second node; and a third transmission gate, wherein a reverse phase control end of the third transmission gate is connected to the fourth voltage signal end; a positive phase control end of the third transmission gate is connected to the third voltage signal end; an input end of the third transmission gate is connected to the second signal input end; an output end of the third transmission gate is connected to the second node;

wherein the first output control module comprises:

a second switch transistor, wherein a gate electrode of the second switch transistor is connected to the first node; a source electrode of the second switch transistor is connected to the second node;

a second phase inverter, wherein an input end of the second phase inverter is connected to the first node; and a third switch transistor, wherein a gate electrode of the third switch transistor is connected to an output end of the second phase inverter, a drain electrode of the third switch transistor is connected to a drain electrode of the second switch transistor;

a third phase inverter, wherein an input end of the third phase inverter is connected to the drain electrode of the second switch transistor and the drain electrode of the third switch transistor, respectively;

a fourth phase inverter, wherein an output end of the fourth phase inverter is connected to a source electrode of the third switch transistor; and a fifth phase inverter, wherein an input end of the fifth phase inverter is connected to an output end of the third phase inverter and an input end of the fourth phase inverter, respectively; an output end of the fifth phase inverter is connected to the first output end;

wherein the second control module comprises:

a fourth transmission gate, wherein an input end of the fourth transmission gate is connected to the second clock signal end; an output end of the fourth transmission gate is connected to the third node; a positive phase control end of the fourth transmission gate is connected to the first output end; a reverse phase control end of the fourth transmission gate is connected to an output end of a sixth phase inverter and a gate electrode of a fifth switch transistor, respectively;

the sixth phase inverter, wherein an input end of the sixth phase inverter is connected to the first output end; the output end of the sixth phase inverter is connected to the reverse phase control end of the fourth transmission end and the gate electrode of the fifth switch transistor, respectively; and the fifth switch transistor, wherein the gate electrode of the fifth switch transistor is connected to the output end of the sixth phase inverter and the reverse phase control end of the fourth transmission gate, respectively; a source electrode of the fifth switch transistor is connected to the third node; a drain electrode of the fifth switch transistor is connected to the second voltage signal end;

wherein the second output control module comprises:

a seventh phase inverter, wherein an input end of the seventh phase inverter is connected to the third node; an output end of the seventh phase inverter is connected to one end of each of N output control sub-modules and an input end of an eighth phase inverter, respectively;

the eighth phase inverter, wherein the input end of the eighth phase inverter is connected to one end of each of the N output control sub-modules and the output end of the seventh phase inverter, respectively; an output end of the eighth phase inverter is connected the other end of each of the N output control sub-modules; and the N output control sub-modules, wherein each of the output control sub-modules is configured to provide a reset signal outputted by the reset signal end to a corresponding one of the N second output ends under the control of an electric potential of the output end of the seventh phase inverter and an electric potential of the output end of the eighth phase inverter; or each of the output control sub-modules is configured to provide a clock signal outputted by a $n^{th}$ third clock signal end to a $n^{th}$ second output end under the control of the electric potential of the output end of the seventh phase inverter and the electric potential of the output end of the eighth phase inverter;

wherein the output control sub-module comprises:

a fifth transmission gate, wherein an input end of the fifth transmission gate is connected to the reset signal end; a positive phase control end of the fifth transmission gate is connected to the output end of the seventh phase inverter; a reverse phase control end of the fifth transmission gate is connected to the output end of the eighth phase inverter;

a sixth transmission gate, wherein an input end of the sixth transmission gate is connected to the N third clock signal ends; a reverse phase control end of the sixth transmission gate is connected to the output end of the seventh phase inverter; a positive phase control end of the sixth transmission gate is connected to the output end of the eighth phase inverter;

a ninth phase inverter, wherein an input end of the ninth phase inverter is connected to an output end of the fifth transmission gate and an output end of the sixth transmission gate, respectively; an output end of the ninth phase inverter is connected to an input end of a tenth phase inverter; and the tenth phase inverter, wherein the input end of the tenth phase inverter is connected to the output end of the ninth phase inverter; an output end of the tenth phase inverter is connected to the second output end;

wherein the first switch transistor, the second switch transistor, the third switch transistor, the fourth switch transistor and the fifth switch transistor each are a N-type transistor.

* * * * *